US012650407B2

(12) United States Patent
Minhas et al.

(10) Patent No.: US 12,650,407 B2
(45) Date of Patent: Jun. 9, 2026

(54) METHOD FOR DETECTING ANALYTES

(71) Applicant: MONASH UNIVERSITY, Clayton (AU)

(72) Inventors: Rajpreet Singh Minhas, Clayton (AU); David Rudd, Clayton (AU); Taryn Guinan, Clayton (AU); Nicolas Hans Voelcker, Clayton (AU)

(73) Assignee: MONASH UNIVERSITY, Clayton (AU)

( * ) Notice: Subject to any disclaimer, the term of this patent is extended or adjusted under 35 U.S.C. 154(b) by 542 days.

(21) Appl. No.: 18/000,876

(22) PCT Filed: Jun. 15, 2021

(86) PCT No.: PCT/AU2021/050617
§ 371 (c)(1),
(2) Date: Dec. 6, 2022

(87) PCT Pub. No.: WO2021/253080
PCT Pub. Date: Dec. 23, 2021

(65) Prior Publication Data
US 2023/0221282 A1    Jul. 13, 2023

(30) Foreign Application Priority Data

Jun. 15, 2020    (AU) ................................. 2020901962

(51) Int. Cl.
G01N 27/623    (2021.01)
H01J 49/04    (2006.01)
(Continued)

(52) U.S. Cl.
CPC ........ G01N 27/623 (2021.01); H01J 49/0418 (2013.01); H10P 14/687 (2026.01); H10P 90/15 (2026.01); *G01N 2560/00* (2013.01)

(58) Field of Classification Search
CPC .............. G01N 27/623; G01N 2560/00; H01J 49/0418; H01L 21/0203; H01L 21/0212
See application file for complete search history.

(56) References Cited

U.S. PATENT DOCUMENTS

2008/0073505 A1*   3/2008   Niu ........................ A61L 27/303
                                250/288
2014/0342103 A1   11/2014   Petersen et al.
(Continued)

FOREIGN PATENT DOCUMENTS

JP       2000/150646 A     5/2000
WO     WO 03/040715 A1    5/2003
(Continued)

OTHER PUBLICATIONS

International Search Report issued Jul. 19, 2021; in PCT/AU2021/050617.
(Continued)

*Primary Examiner* — Georgia Y Epps
*Assistant Examiner* — Hanway Chang
(74) *Attorney, Agent, or Firm* — Knobbe, Martens, Olson & Bear LLP

(57) ABSTRACT

The invention provides a method for detecting one or more analytes, the method comprising: providing a substrate comprising a semiconductor with a porous surface, wherein the porous surface is coated with a fluorocarbon polymeric coating; contacting the porous surface with a fluid or object so that the one or more analytes are retained on the substrate when present in the fluid or on the object; and analysing the substrate by mass spectrometry to detect the one or more analytes if present on the substrate.

20 Claims, 11 Drawing Sheets

⊢500 nm⊣

(51) Int. Cl.
    *H10P 14/68*       (2026.01)
    *H10P 90/00*       (2026.01)

(56)         References Cited

U.S. PATENT DOCUMENTS

2018/0269052 A1    9/2018   Gao et al.
2019/0376119 A1*  12/2019  Thayer ................. C12Q 1/6804

FOREIGN PATENT DOCUMENTS

| | | |
|---|---|---|
| WO | WO 2005/017487 A2 | 2/2005 |
| WO | WO 2006/118595 A2 | 11/2006 |
| WO | WO 2007/112234 A2 | 10/2007 |
| WO | WO 2014/164026 A2 | 10/2014 |
| WO | WO 2015/168724 | 11/2015 |

OTHER PUBLICATIONS

Law, K. P., 'Laser desorption/ionization mass spectrometry on nanostructured semiconductor substrates: DIOS™ and QuickMass™', International Journal of Mass Spectrometry vol. 290, Issues 2-3, Feb. 15, 2010, pp. 72-84.

Minhas, R. S. et al., 'Rapid Detection of Anabolic and Narcotic Doping Agents in Saliva and Urine by Means of Nanostructured Silicon SALDI Mass Spectrometry', ACS Appl. Mater. Interfaces 2020, vol. 12, pp. 31195-31204, Jun. 17, 2020.

Minhas, R. S. et al., 'Fluorocarbon Plasma Gas Passivation Enhances Performance of Porous Silicon for Desorption/Ionization Mass Spectrometry', ACS Sen. 2020, vol. 5, pp. 3226-3236, Jun. 17, 2020.

Zhou, Y. et al., 'Salt Segregation and Sample Cleanup on Perfluoro-Coated Nanostructured Surfaces for Laser Desorption Ionization Mass Spectrometry of Biofluid Samples', ACS Anal. Chem. 2017, 89, 3362-3369, Feb. 19, 2017.

Extended European Search Report dated Jun. 18, 2024, corresponding to European Patent Application No. 21825187.4.

Guinan, Taryn, et al. "Rapid detection of illicit drugs in neat saliva using desorption/ionization on porous silicon." Talanta 99 (2012): 791-798.

Gilliam, et al., Plasma Polymerization Behavior of Fluorocarbon Monomers in Low-Pressure AF and RF Discharges. Plasma Process. Polym. 2007, 4, 165-172.

Jarvis, et al., Investigating the penetration of a plasma polymer film into porous silicon with helium ion microscopy., Surface & Coatings Technology 507(2025) 132150.

Singh, et al., Fluorocarbon Plasma Gas Passivation Enhances Performance of Porous Silicon for Desorption/Ionization Mass Spectrometry, ACS Sens. 2020, 5, 3326-3236.

* cited by examiner

Polymyxin B m/z 1225.7 ±0.25          Polymyxin B m/z 1225.7 ±0.25

METHOD FOR DETECTING ANALYTES

CROSS REFERENCE TO RELATED APPLICATIONS

The present application is a U.S. National Phase under 35 U.S.C § 371 of International Patent Application No. PCT/AU2021/050617, filed Jun. 15, 2021, which claims benefit of priority to Australian Patent Application No. 2020901962, filed Jun. 15, 2020, which is incorporated by reference in its entirety.

TECHNICAL FIELD

The present invention relates to a method for detecting one or more analytes comprising: providing a substrate comprising a semiconductor with a porous surface coated with a fluorocarbon polymeric coating, contacting the porous surface with a fluid or object so that the one or more analytes are retained on the substrate when present in the fluid or on the object, and analysing the substrate by mass spectrometry to detect the one or more analytes if present on the substrate. The invention also relates to a fluorocarbon polymer-coated substrate for retaining analytes to detect, and to uses of such substrates and methods of producing such substrates.

BACKGROUND OF INVENTION

High-throughput detection and quantification of various analytes is becoming increasingly important in many fields including clinical diagnostics, environmental contaminant monitoring, anti-doping testing and illicit drug detection. Analysis of large numbers of samples using conventional chromatographic methods, which can take between 5 and 30 minutes per sample, requires multiple instruments and a substantial commitment of technician time, resulting in inflated costs.

High resolution mass spectrometry techniques are of particular interest due to the potential for rapid processing and because a single sample can be prepared for analysis and then tested multiple times. High throughput analysis using matrix-assisted laser desorption-ionisation (MALDI) in particular is emerging as a viable technique due to advances in automation for sample handling, sample preparation and the use of such instruments with multiplex capabilities.

In the MALDI technique, a UV laser is used to desorb and ionise analytes co-crystallised with an organic matrix that has been deposited on a conductive substrate surface. MALDI is a soft ionisation technique in that it efficiently generates intact molecular ions in the gas phase. Thus, MALDI is particularly suited for the mass spectrometric analysis of non-volatile, high molecular weight compounds including proteins, peptides, oligonucleotides, oligosaccharides and synthetic polymers.

Traditional MALDI-MS does, however, have some disadvantages. These include a non-homogenous co-crystallisation of the analyte within the matrix resulting in poor shot-to-shot and sample-to-sample reproducibility. The detection of small molecules below 700 Dalton is also difficult due to the matrix and its fragment peaks appearing as intense signals in the same spectral range. Thus, there has been a shift towards matrix-free soft ionisation techniques and in particular surface-assisted laser desorption-ionisation (SALDI).

Desorption-ionisation on porous silicon (DIOS) is an effective SALDI technique for small molecule mass spectroscopic analysis. This matrix-free approach uses a thin porous silicon (pSi) surface layer on a Si wafer as the substrate. The porous surface and the UV absorbance of the pSi substrate are both important properties for the DIOS application: the high surface area allows the analyte to be concentrated in a small area of the substrate in intimate contact with the substrate surface, while the semiconductive silicon material acts as an energy receptacle for the UV laser. The energy absorbed from the laser is transferred to the analyte which desorbs and ionises before being detected in a mass spectrometer, e.g. time-of-flight (TOF) mass spectrometer, with minimal analyte degradation. DIOS is particularly useful in detecting molecules from a few hundred to a few thousand Da, such as illicit drugs, due to the absence of a matrix.

Previous studies have shown that modification of the pSi surface by silanization chemistry, typically with fluorinated silane molecules, can improve the stability and sensitivity for DIOS-MS applications. The shelf-life of the substrate is increased, allowing it to be used after many months of storage, while simultaneously increasing its DIOS-MS activity. The silanization also increases the hydrophobicity of the surface, causing an aqueous sample to bead on the surface. After absorption, the analyte is thus localised in a small area of the substrate relative to a conventional stainless steel or unfunctionalised silicon substrate, leading to a greater molecular concentration of analyte within the pores.

Surface modification by silanization however suffers from a number of disadvantages. The process is time-consuming, taking 15-60 mins for completion, and involves costly and potentially toxic chemicals. It is thus challenging to scale up industrially. Moreover, the "wet" silanization chemistry is inherently susceptible to provide inhomogeneous and irreproducible surface properties, particularly on a porous substrate where is can be difficult to spread the reagents evenly over the entire surface.

There is therefore an ongoing need for new mass spectrometry-based methods of detecting analytes, and substrates to retain analytes for mass spectroscopy analysis, which at least partially address one or more of the above-mentioned short-comings, or provide a useful alternative.

A reference herein to a patent document or other matter which is given as prior art is not to be taken as an admission that the document or matter was known or that the information it contains was part of the common general knowledge as at the priority date of any of the claims.

SUMMARY OF INVENTION

In accordance with a first aspect, the invention provides a method for detecting one or more analytes, the method comprising: providing a substrate comprising a semiconductor with a porous surface, wherein the porous surface is coated with a fluorocarbon polymeric coating; contacting the porous surface with a fluid or object so that the one or more analytes are retained on the substrate when present in the fluid or on the object; and analysing the substrate by mass spectrometry to detect the one or more analytes if present on the substrate.

The inventors have found that fluorocarbon polymeric coatings provide a number of advantages compared with surface functionalisation approaches previously used on SALDI substrates. These include the highly reproducible coating properties produced across the surface of a substrate and from substrate to substrate. This significantly improves on wet chemical silanization methods and facilitates greater precision and repeatability in quantitative SALDI-MS analyses. Moreover, fluorocarbon polymeric coatings can be rapidly produced by plasma deposition techniques, offering significant advantages over wet-chemical methods in commercial scale-up. Surprisingly, it was found that the formation of fluorocarbon coatings on highly porous, nano/microstructured semiconductor surfaces does not unacceptably reduce the porosity or interfere with the transfer of energy from substrate to analyte required for desorption and ionisation. In fact, substantially higher signal intensities could be obtained on a fluorocarbon polymer-coated substrate than on the same substrate treated with conventional fluorinated silane small molecule surface modifiers. Thus, highly sensitive SALDI-MS analyses can be performed using the coated substrates, with limits of detection and quantification that rival or surpass those from previously reported SALDI techniques.

In some embodiments, the semiconductor is a silicon semiconductor, such as a doped silicon semiconductor.

In some embodiments, the porous surface comprises a plurality of pores formed in the semiconductor, the pores having an average pore diameter of from 5 nm to 300 nm. The pores may have an average pore diameter of from 50 to 200 nm.

In some embodiments, the porous surface comprises a plurality of pores formed in the semiconductor, the pores having an average pore depth of from 50 to 15000 nm, such as from 100 to 500 nm.

In some embodiments, the porous surface has a porosity of 40-90% and/or the substrate has a surface area of 100-800 $m^2/g$.

In some embodiments, the fluorocarbon polymeric coating has a thickness in the range of 5 to 15 nm, such as in the range of 7 to 12 nm.

In some embodiments, the fluorocarbon polymeric coating comprises a fluorocarbon plasma polymer. The fluorocarbon plasma polymer may be produced by contacting the porous surface with a fluorocarbon plasma. The fluorocarbon plasma may be a plasma of one or more fluorocarbon gases, optionally wherein the one or more fluorocarbon gases comprise at least one, and preferably two or more, selected from $C_4F_8$, $CF_4$ and $CHF_3$.

In some embodiments, analysing the substrate by mass spectrometry comprises using an ionisation technique selected from laser desorption-ionisation (LDI), desorption electrospray ionisation (DESI), atmospheric pressure chemical ionisation (APCI), Fast Atom Bombardment (FAB), and Direct Analysis in Real-Time (DART).

In some embodiments, the mass spectrometry is laser desorption-ionisation mass spectrometry, such as UV laser desorption-ionisation mass spectrometry. Optionally, the UV laser desorption-ionisation mass spectrometry is performed using a MALDI-TOF mass spectrometer.

In some embodiments, the porous surface is contacted with a fluid to detect the one or more analytes when present in the fluid.

Contacting the porous surface with a fluid may comprise dropping the fluid onto the substrate and evaporating volatile components of the fluid.

In some embodiments, the fluid is obtained by extracting an aqueous biological fluid with a solvent, wherein the one or more analytes are extracted into the solvent if present in the biological fluid. The aqueous biological fluid may be saliva.

In some embodiments, the method comprises quantifying the concentration of at least one of the analytes in the fluid by comparing a mass spectrometry signal intensity associated with the analyte with a calibration curve of signal intensity versus concentration predetermined for the analyte and the substrate.

In some embodiments, the analysing comprises comparing a mass spectrometry signal intensity associated with at least one of the analytes against a limit of detection (LOD) and/or a limit of detection (LOQ) value predetermined for the analyte and the substrate.

In some embodiments, the analytes are selected from the group consisting of illicit drugs and metabolites thereof, performance enhancing doping agents and metabolites thereof, agrochemical residues and biomarker peptides.

In accordance with a second aspect, the invention provides a coated substrate for retaining analytes to detect, the substrate comprising a semiconductor with a porous surface, wherein the porous surface is coated with a fluorocarbon polymeric coating.

In some embodiments, the semiconductor is a silicon semiconductor, such as a doped silicon semiconductor.

In some embodiments, the porous surface comprises a plurality of pores formed in the semiconductor, the pores having an average pore diameter of from 5 nm to 300 nm. The pores may have an average pore diameter of from 50 to 200 nm.

In some embodiments, the porous surface comprises a plurality of pores formed in the semiconductor, the pores having an average pore depth of from 50 to 15000 nm, such as from 100 to 500 nm.

In some embodiments, the porous surface has a porosity of 40-90% and/or the substrate has a surface area of 100-800 $m^2/g$.

In some embodiments, the fluorocarbon polymeric coating has a thickness in the range of 5 to 15 nm, such as in the range of 7 to 12 nm.

In some embodiments, the fluorocarbon polymeric coating comprises a fluorocarbon plasma polymer. The fluorocarbon plasma polymer may be produced by contacting the porous surface with a fluorocarbon plasma. The fluorocarbon plasma may be a plasma of one or more fluorocarbon gases, optionally wherein the one or more fluorocarbon gases comprise at least one, and preferably two or more, selected from $C_4F_8$, $CF_4$ and $CHF_3$.

In some embodiments, coated substrate is in the form of a chip.

In accordance with a third aspect, the invention provides a kit comprising a coated substrate according to any of the embodiments disclosed herein in the form of a chip, and a chip holder configured to be inserted into a mass spectrometer.

In accordance with a fourth aspect, the invention provides use of a coated substrate according to any of the embodiments disclosed herein to retain one or more analytes present in a fluid or on an object for detection.

In accordance with a fifth aspect, the invention provides a method of producing a coated substrate, the method comprising: providing a substrate comprising a semiconductor with a porous surface; and contacting the substrate with a fluorocarbon plasma, thereby coating the porous surface with a fluorocarbon polymeric coating.

In some embodiments, the semiconductor is a silicon semiconductor, such as a doped silicon semiconductor.

In some embodiments, the porous surface comprises a plurality of pores formed in the semiconductor, the pores having an average pore diameter of from 5 nm to 300 nm. The pores may have an average pore diameter of from 50 to 200 nm.

In some embodiments, the porous surface comprises a plurality of pores formed in the semiconductor, the pores having an average pore depth of from 50 to 15000 nm, such as from 100 to 500 nm.

In some embodiments, the porous surface has a porosity of 40-90% and/or the substrate has a surface area of 100-800 $m^2/g$.

In some embodiments, providing the semiconductor with a porous surface comprises producing pores in a precursor semiconductor substrate by light-assisted anodic etching.

In some embodiments, the fluorocarbon plasma is generated by electrical discharge into one or more fluorocarbon gases. The one or more fluorocarbon gases may comprise at least one, and preferably two or more, selected from $C_4F_8$, $CF_4$ and $CHF_3$. In some embodiments, the one or more fluorocarbon gases comprise $C_4F_8$, and preferably each of $C_4F_8$, $CF_4$ and $CHF_3$.

In some embodiments, the plasma is generated by simultaneous inductively coupled plasma electrical discharge into the one or more fluorocarbon gases and radio frequency (RF) biasing of the substrate.

In some embodiments, the substrate is contacted with the plasma for a coating time of less than 20 seconds, such as less than 10 seconds, for example no more than 5 seconds.

In some embodiments, the fluorocarbon polymeric coating has a thickness in the range of 5 to 15 nm, preferably in the range of 7 to 12 nm.

In accordance with a sixth aspect, the invention provides a coated substrate produced by a method according to any of the embodiments disclosed herein.

Where the terms "comprise", "comprises" and "comprising" are used in the specification (including the claims) they are to be interpreted as specifying the stated features, integers, steps or components, but not precluding the presence of one or more other features, integers, steps or components, or group thereof.

Further aspects of the invention appear below in the detailed description of the invention.

BRIEF DESCRIPTION OF DRAWINGS

Embodiments of the invention will herein be illustrated by way of example only with reference to the accompanying drawings in which.

DETAILED DESCRIPTION

Figure 1:
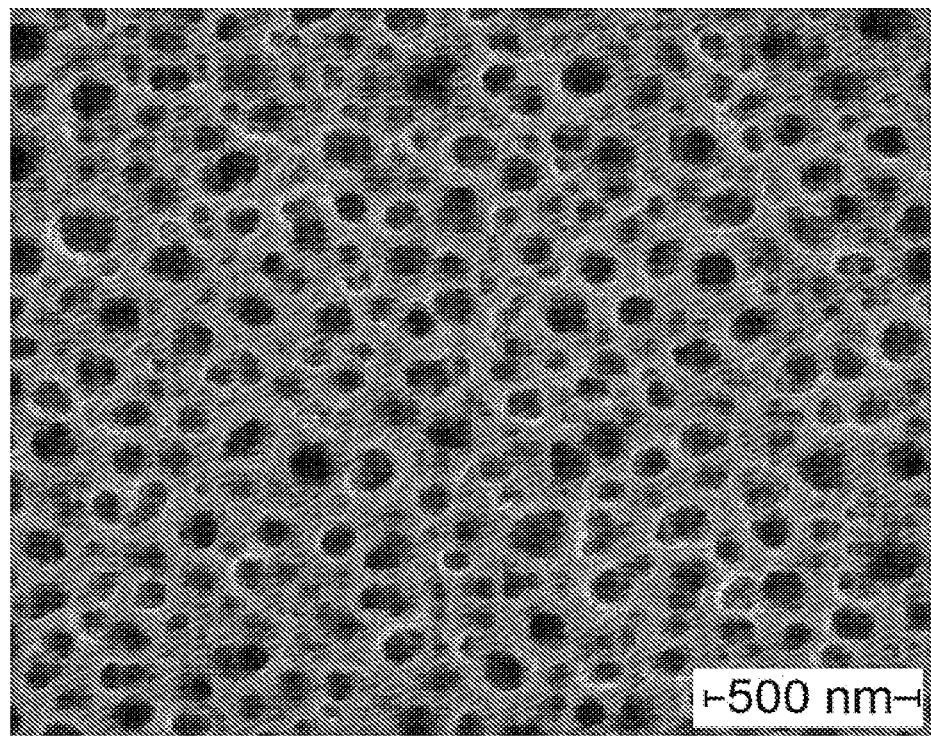
FIG. 1 depicts scanning electron microscopy (SEM) images of pSi substrates, as produced in Example 1, in median plan view.

The present invention relates to methods of analysis, in particular to the detection of analytes present in a fluid or on an object by mass spectroscopy. The inventors have shown that a semiconductive substrate having a porous surface coated with a fluorocarbon polymeric coating is particularly suited to retain a wide variety of analytes present in various fluids for subsequent matrix-free mass spectrometric analysis. Moreover, such substrates can be rapidly and reproducibly prepared using scalable techniques.

Coated Substrate

In one aspect the present invention relates to a coated substrate for retaining analytes on the surface for detection, in particular by desorption-ionisation mass spectrometry analysis. The substrate comprises a semiconductor with a porous surface which is coated with a fluorocarbon polymeric coating.

The substrate comprises a semiconductor material in at least a surface region of the substrate. In some embodiments, the substrate comprises or consists of a wafer or other sheet of semiconductor material. The semiconductor may be formed from a continuous single crystal, e.g. a single crystal wafer, or a polycrystalline material. It is also envisaged for some applications that the substrate may comprise particles of semiconductor material.

A key role of the semiconductor material is to absorb light, such as ultraviolet (UV) laser light, and transfer the energy to the analyte to cause desorption and ionisation. Accordingly, the semiconductor may be any semiconductive material capable of absorbing light of suitable wavelength and intensity to cause desorption and ionisation of an analyte retained on its surface. In some embodiments, the semiconductor exhibits high absorption of UV light, in particular UV laser light (e.g. with a wavelength between 250 and 360 nm) as used in conventional MALDI mass spectrometry.

In some embodiments, the semiconductor is selected from a silicon semiconductor, a germanium semiconductor and an indium tin oxide semiconductor or a combination of semiconductors such as a silicon-germanium mixed semiconductor. In some embodiments the semiconductor is a silicon semiconductor, for example an n-type or p-type doped silicon semiconductor. The dopant may be a conventional n-type dopant such as phosphorous, boron or antimony.

The semiconductor material of the substrate has a porous surface in at least a zone of the substrate where an analyte is to be received and retained. The porous surface ensures intimate contact between the analyte and the coated substrate surface on which it is retained. Thus, when the surface is irradiated with the laser during SALDI, the surface-absorbed energy is transferred rapidly and evenly to the analyte causing reproducible and well-controlled desorption and ionisation. Moreover, the porous structure of the surface allows a larger amount of analyte to be retained on the surface in the analysis zone than a non-porous surface of similar composition.

As used herein, a porous surface of a solid material refers to a nano- or micro-structured surface region having porosity which communicates with the surface. In some embodiments, the nano/micro-structured surface region is characterised by well-defined cavity-type pores having internal walls and a pore mouth which opens to the surface. However, suitable surface porosity can be provided by other types of nano- or micro-structured formations in the surface region, for example nanostructures grown on or otherwise forming part of the surface. It will be appreciated that a substrate with a porous surface has a greater surface area than a substrate of similar dimensions but which has a non-porous surface.

In some embodiments, the porous surface comprises a plurality of pores formed in the semiconductor material. The pores may have an average pore diameter of from 5 nm to 300 nm. Porous substrates with a range of different mesoporous and microporous pores sizes, including about 10 nm and about 100 nm, have been disclosed by Guinan et al in *Talanta* 132 (2015) 494-502 for SALDI applications. It is envisaged that such materials may be surface-modified with fluorocarbon polymeric coatings according to the present invention.

In some embodiments, the average pore diameter is greater than 50 nm, such from 50 to 200 nm. In such embodiments, the pores may have an average pore depth of greater than 50 nm, or greater than 100 nm, such as from 50 to 15000 nm or from 100 to 500 nm. The pores of such porous surfaces may thus be characterised as macropores. Pore diameters and depths may be measured by scanning electron microscopy measurements. The inventors have demonstrated that a silicon semiconductor with a surface having open macropores of an average diameter of about 100 nm and an average depth of about 212 nm is well suited, when coated with a fluorocarbon polymeric coating, to retain analytes for DIOS-mass spectroscopic analysis.

In some embodiments, the porous surface has a porosity of 40-90%. In some embodiments the substrate has a surface area of 100-800 $m^2/g$.

Porous silicon (pSi) and porous germanium (pGe) substrates having macropores may be provided by etching respective silicon or germanium precursor substrates, e.g. wafers, using electrochemical etching techniques as will be described in greater detail hereafter. The size of the pores may be controlled by adjusting the etch process parameters.

In some embodiments, the substrate comprises a generally non-porous semiconductor surface, such as a silicon wafer, having a plurality of discrete porous surface zones, for example in an ordered array across the surface of the wafer. Each porous surface zone may thus be configured to receive a different sample for analysis, so that the substrate is configured for multiplex SALDI-MS analysis. The analysis zones are spaced apart by the intermediate non-porous substrate areas so that the risk of cross-contaminating different samples is reduced. Discrete porous surface zones can be formed in a porous silicon wafer substrate by masking during the etching.

In some embodiments, the substrate is a silicon substrate having a porous surface provided by silicon nanostructures formed or grown on the surface. For example, the substrate comprises silicon nanopillars produced on a silicon wafer substrate as disclosed in WO2015/188724. In another example, the substrate comprises silicon nanowires grown on the surface by silane vapour deposition; such substrates when surface-modified with fluorinated silanes have previously been used in a SALDI technique called nanoassisted laser desorption-ionisation (NALDI).

In some embodiments, the substrate is in the form of a chip, such as a silicon wafer chip. The chip may have dimensions such that it is configured to be clipped in or otherwise positioned in the sample holder of a mass spectrometer.

In some embodiments, the substrate is in particulate form, for example comprising microparticles with a mean size in the range of 1 to 50 microns. In some embodiments, the substrate comprises pSi microparticles as disclosed in WO2015/188724. Such microparticles may be formed by producing a silicon wafer with surface porosity and then detaching and comminuting the porous surface layer.

The porous surface of the semiconductor is coated with a fluorocarbon polymeric coating. Fluorocarbon polymers comprise chains of carbon atoms with multiple carbon-fluorine (C—F) bonds throughout the polymer structure. The stable carbon-fluorine bonds tend to provide polymer properties such as hydrophobicity, high melting temperatures, chemical inertness, and resistance to degradation which are desirable in the present application. However, it is to be understood that the fluorocarbon polymeric coating is not limited in composition to carbon and fluorine but may include other atoms including hydrogen (i.e. C—H bonds in addition to the C—F bonds).

The fluorocarbon polymeric coating generally covers the nano/micro-structured surface of the semiconductor sufficiently to alter the surface properties and/or to stabilise the porous surface structure. In particular, the coated surface may be more hydrophobic than the surface absent the coating, as measured for example by water contact angle measurements. Furthermore, the surface coating may advantageously stabilise and protect the nano/micro-structured surface, limiting the physical degradation of the porosity and minimising contamination when exposed to air. The fluorocarbon polymeric coating is generally a thin coating which may approximately conform to the nano/micro-structure of the underlying semiconductive material. It will be understood that the surface of the substrate thus remains porous despite the presence of the coating.

The coated surface may have a water contact angle of greater than 100°, such as greater than 110°, as measured with a contact angle goniometer. By contrast, the uncoated substrate, i.e. of similar semiconductor surface composition and structure, may have a contact angle of less than 60°, or less than 50°.

The fluorocarbon polymeric coating may have a thickness in the range of 5 to 15 nm, such as in the range of 7 to 12 nm. Such thicknesses are well adapted to coat macroporous surfaces, where the pore dimensions are generally greater than 50 microns, without blocking the pores. The coating thickness may be measured by techniques such as variable-angle spectroscopic ellipsometry.

In some embodiments, the fluorocarbon polymeric coating comprises a fluorocarbon plasma polymer. Such coatings are generally produced by contacting the substrate to be coated with a fluorocarbon plasma, which may be produced by techniques such as electrical discharge into fluorocarbon gases or by sputtering a fluorocarbon polymer target. The fluorocarbon radicals in the plasma combine to form larger species which condense as a thin polymeric film on the substrate. Fluorocarbon plasma polymers thus have a complex, highly branched molecular structure which can nevertheless be characterised as having fluorocarbon species such as —$CF_2$— and —$CF_3$ by XPS analysis.

The inventors have found that a fluorocarbon plasma polymeric coating can readily be produced on pSi substrates having a macroporous surface, while maintaining a porosity needed to retain an analyte for DIOS and while still permitting sufficient energy transfer from the light-absorbing semiconductor to the analyte. The coated substrates have consistent surface properties across the surface of each substrate and the process is highly reproducible from substrate to substrate. This provides a significant improvement over wet-chemical silanization modification methods and facilitates greater precision and repeatability in quantitative SALDI-MS analyses. Moreover, without wishing to be bound by any theory, it is believed that the fluorocarbon polymer coating, with which the analyte is in direct contact, contributes to the absorption/diffusion of energy and the resulting ionisation at the molecular scale during desorption-ionisation analysis of the analyte.

The fluorocarbon plasma polymer coating may be produced from a plasma of one or more fluorocarbon gases. A wide variety of fluorocarbon gases may be used, including but not limited to octafluorocyclobutane ($C_4F_8$), perfluorobutane ($C_4F_{10}$), hexafluoropropene ($C_3F_6$), tetrafluoroethane ($C_2F_4H_2$), tetrafluoroethylene ($C_2F_4$), tetrafluoromethane ($CF_4$) and trifluoromethane ($CHF_3$). In some embodiments, the plasma polymer coating is derived from two or more precursor gases, for example two or more or each of $C_4F_8$, $CF_4$ and $CHF_3$. The inventors have found that a combination of fluorocarbon precursor gases may lead to a superior coating for SALDI-MS applications. It has also been found that the properties of the fluorocarbon plasma polymer coating are dependent to an extent on the plasma coating process parameters as will be further described hereafter.

Method of Producing a Coated Substrate

The present invention also relates to a method of producing a coated substrate. The method requires providing a substrate comprising a semiconductor with a porous surface. This substrate is contacted with a fluorocarbon plasma, thereby coating the porous surface with a fluorocarbon polymeric coating.

The semiconductor with porous surface may generally be according to any of the embodiments disclosed herein in relation to the coated substrate of the invention. Methods for producing a variety of porous semiconductive substrates with composition and surface nano- or micro-structuring suitable for SALDI have previously been reported and are available to the skilled person.

In some embodiments, the substrate is a porous silicon or porous germanium substrate, for example a silicon wafer with open macropores formed in the surface as disclosed herein. Porous silicon (pSi) and porous germanium (pGe) substrates having macropores may be provided by etching respective silicon or germanium precursor substrates, e.g. wafers, using electrochemical etching techniques.

In some embodiments, the substrate is a pSi substrate. One technique for preparing pSi substrates is light-assisted anodic etching, as reported for example by Guinan et al in *Talanta* 132 (2015) 494-502. In this approach, a silicon precursor substrate such as a single crystal silicon wafer is placed on the anode of an anodization cell, contacted with an etching electrolyte such as hydrofluoric acid (e.g. diluted in alcohol such as ethanol), and illuminated with collimated white light while a current is passed through the cell. Optionally, a photomask is used to produce porous patterning on the substrate. Thus, a plurality of discrete porous surface zones, for example an ordered array of analysis zones across the surface of the wafer, may be produced.

The freshly etched pSi substrate may then be washed, dried and subjected to an oxidising treatment, e.g. with UV, ozone or a thermal oxidation process. A second etching step, followed again by surface washing and oxidation, may be used to broaden the pores. The pSi substrate produced in this way comprises macropores of suitable dimensions for DIOS and has a hydrophilic surface characterised by oxidic surface functionality including hydroxyl groups (Si—OH). The pore dimensions can be controlled via selection of the etching parameters, including HF concentration, etching current, etching time and addition of surfactants/co-modifiers, according to reported methods.

In some embodiments, the substrate is in particulate form, for example comprising pSi microparticles with a mean size in the range of 1 to 50 microns. One technique for producing pSi microparticles is disclosed in WO2015/188724. Initially, a silicon wafer is electrochemically etched to produce a porous surface layer using a similar method to that described above. The porous surface layer is then detached and comminuted by a technique such as sonication or milling. The resultant microparticles may be classified by sieving to produce pSi microparticles of the target particle size range.

Optionally, the porous surface may be functionalised with the fluorocarbon polymer either before or after the comminution.

Methods of producing fluorocarbon plasma polymer coatings on a variety of substrates have been reported, for example by Kay et al, *Plasma chemistry of fluorocarbons as related to plasma etching and plasma polymerization* in Plasma Chemistry III. Topics in Current Chemistry (1980) vol 94. Springer, Berlin, Heidelberg. Generally, a fluorocarbon plasma is contacted with the substrate under conditions where fluorocarbon radicals in the plasma combine and condense on the substrate as a polymeric coating. The fluorocarbon plasma may be generated by electric discharge into fluorocarbon gases but other methods are also envisaged, including argon sputtering of fluorocarbon polymer (e.g. PTFE) solid targets.

In some embodiments, the method comprises generating the fluorocarbon plasma by electrical discharge into one or more fluorocarbon gases. The electrical discharge may be produced by conventional methods including direct current (DC), alternating current (AC) discharge, radio frequency (RF) discharge, inductively coupled plasma (ICP) discharge and the like.

A wide variety of fluorocarbon gases may be used, including but not limited to octafluorocyclobutane ($C_4F_8$), perfluorobutane ($C_4F_{10}$), hexafluoropropene ($C_3F_6$), tetrafluoroethane ($C_2F_4H_2$), tetrafluoroethylene ($C_2F_4$), tetrafluoromethane ($CF_4$) and trifluoromethane ($CHF_3$). In some embodiments, two or more fluorocarbon gases are used to produce the plasma, for example two or more, or each of, $C_4F_8$, $CF_4$ and $CHF_3$. The inventors have found that a combination of fluorocarbon precursor gases may lead to a superior coating, as measured by the signal response of an analyte in DIOS-MS analysis.

In some embodiments, the substrate is placed in a deposition chamber on a sample holder, and the fluorocarbon gas(es) are flowed through the chamber and over the sample at a selected flow rate and chamber pressure. The plasma is generated by inductively coupled plasma discharge directly into the gases, preferably in combination with biasing of the substrate via the sample holder using a radio frequency generator.

Suitable techniques for performing plasma deposition in this way are known to the person skilled in the art, and include plasma enhanced chemical vapour deposition (PECVD) and inductively coupled plasma chemical vapour deposition (ICPCVD). The inventors have used an instrument configured for deep reactive-ion etching (DRIE), with capability to perform both plasma deposition (used in the current methods) and ion bombardment etching (not used). However dedicated instruments for PECVD and ICPCVD are commercially available and may be used in the methods of the present invention.

It will be appreciated that the properties of the fluorocarbon plasma polymer coating will depend at least to an extent on the control of various parameters in the coating process. These conditions may include the selection of the precursor gas mixture (as discussed above), the deposition pressure (i.e. the pressure maintained in the deposition chamber), the flow rate of gases, the discharge energy and the coating time. The inventors have demonstrated that fluorocarbon polymeric coatings suitable for SALDI-MS substrates may be produced across a wide range of conditions, but that the performance (as measured by the signal response of an analyte in DIOS-MS analysis) may be optimised in a number of ways. In particular, higher density plasmas and shorter coating times tended to provide enhanced performance.

Higher density plasmas may generally be provided by increasing the discharge energy and/or by reducing the deposition pressure. Thus, the use of (i) RF power (e.g. 200-400 W) biasing of the substrate in combination with the ICP discharge to the gases and (ii) low chamber pressures (e.g. less than 50 mTorr, such as 1-20 mTorr) were found to produce superior coatings.

Short coating times, such as less than 20 seconds, preferably less than 10 seconds, were also found to favour the performance. It was found that a fluorocarbon plasma polymer coating could be deposited on a pSi substrate after only 2 seconds of plasma contact and that limited further increases in thickness occurred after 7 seconds contact. A stronger analyte signal response was obtained after a 5 second contact coating compared to 10 second contact and longer coating times. Advantageously, the fabrication time of the fluorinated surface treatment is thus extremely short compared to wet chemical methods involving surface reactions with fluorosilane compounds. Moreover, the plasma polymer coating method was found to produce highly reproducible coatings with good signal intensity in SALDI-MS analyses.

Methods of Detecting Analyte(s)

The present invention further relates to a method for detecting one or more analytes in a fluid or on an object. The method comprises providing a substrate comprising a semiconductor with a porous surface, wherein the porous surface is coated with a fluorocarbon polymeric coating. The method further comprises contacting the porous surface with a fluid or object so that at least a portion of the one or more analytes, should they be present in the fluid or on the object, is transferred to and retained on the substrate. The substrate is then subjected to analysis by mass spectrometry, such as laser desorption-ionisation mass spectrometry, to detect the one or more analytes if they are present on the substrate.

The substrate may generally be according to any of the embodiments disclosed herein in relation to the coated substrate of the invention.

In some embodiments, the substrate is contacted with a fluid to detect one or more analytes which may be present in the fluid. As used herein, a fluid refers to either a liquid or a vapour. The fluid may be dropped onto the substrate. Volatile components of the fluid including water or solvent may then be evaporated leaving the analytes of interest dispersed on the porous, coated surface. In other embodiments, the substrate is immersed in the fluid, for example in microparticulate form as described herein. The substrate is then recovered from the fluid, for example by filtration, and analysed.

In some embodiments, the fluid is an aqueous fluid. The fluorocarbon polymer-coated substrates of the invention have been found to be hydrophobic, such that aqueous fluids tend to bead when dropped onto the surface rather than spreading over the surface. Accordingly, the analytes of interest are concentrated in a small area of the substrate, thus facilitating the detection of low concentrations of analyte and the capability for multiplex analysis of a large number of samples on a given substrate surface area.

In some embodiments, the fluid is a biological fluid. A wide range of biological fluids may be subjected to analysis according to the methods of the invention, including saliva, sweat, blood, tears, urine, mucous, semen, faecal matter and the like. The methods are also considered applicable to vaporous fluids such as breath. The fluid may be contacted with the porous surface of the substrate as is or it may be further processed to facilitate the analysis. In some embodiments, the fluid is an extract of a biological fluid. Biological fluids are typically aqueous fluids and a water-immiscible solvent may thus be used to extract certain analytes of interest, such as illicit drugs and doping agents. This approach has the advantage that the fluid actually analysed is separated from naturally-occurring biological and solid components present in biological fluids which may otherwise confound the analysis.

In some embodiments, the biological fluid is saliva. The inventors have demonstrated that the methods of the invention may be used to detect illicit drugs such as cocaine in saliva with a limit of detection (LOD) of as low as about 2 ng/mL.

In some embodiments, the fluid comprises an internal standard, which may be spiked into the fluid in a predetermined amount. The signal intensity of the analyte of interest, relative to the internal standard, may thus be used to quantify the amount of the analyte present in the fluid. For example, a deuterated equivalent of an illicit drug may be used as an internal standard for the detection of the illicit drug in biological fluids such as saliva or blood.

In some embodiments, the substrate is contacted with an object to detect one or more analytes which may be present on the surface of the object. In some embodiments, the object is part of a human body, for example part of the hand such as a fingertip. By contacting the fingertip with the porous substrate, analytes such as illicit drugs may be transferred to the coated, porous surface of the substrate for subsequent detection. In some embodiments, the object is human or animal tissue extracts and samples. Tissue extracts can be fixed to In some embodiments, the substrate is in particulate form as disclosed herein. Microparticles of the coated substrate may be dusted onto a surface of an object of interest, as generally disclosed in WO2015/188724. The microparticles may adhere to the surface, particularly when fingerprints or residues of biological fluids are present on the surface. Various analytes present on the surface may be transferred to the porous surface of the microparticulate substrate. The microparticles may then be analysed by SALDI-MS directly on the surface or may be removed from the surface prior to analysis.

A wide variety of analytes may be detected in the method of the invention, for example illicit drugs and metabolites thereof, performance enhancing doping agents and metabolites thereof, agrochemical residues and biomarker peptides.

In some embodiments, the analyte(s) are illicit drugs and/or a metabolites thereof. The illicit drugs may be selected form cocaine, methamphetamine (MA), 3,4-methylenedioxymethamphetamine (MDMA) and tetrahydrocannabinol (THC), among other substances. The inventors have demonstrated that common illicit drugs such as cocaine can be detected with excellent sensitivity on the substrates of the invention. The methods can thus be used in roadside and workplace testing for illicit drug use.

In some embodiments, the analyte(s) are performance enhancing doping agents or a metabolites thereof. Rapid and cost-effective screening tests which are able to detect a wide range of doping agents, including those present on the World Anti-Doping Agency (WADA) Prohibited List, are required. The inventors have demonstrated that the presence of doping agents such as testosterone and cortisol (hydrocortisone) may be detected by the present methods.

In some embodiments, the analyte(s) are agrochemical residues, for example pesticides, including insecticides, herbicides, fungicides and nematicides, fertilizers and degradation products of any of these. Environmental contamination is an ever-present issue, particularly in the agricultural industry, due to the volume of produce that is cultivated worldwide. The commonplace use of pesticides has led to concerns about pesticidal residues found in food products including fruits and vegetables, leading to regulation by consumer health authorities. Testing of maximum residue limits is now conducted in laboratories throughout the world in order to meet regulatory requirements and ensure that there is minimal disruption of the supply chain. Rapid, low cost and high throughput testing methods for agrochemical residues are thus needed. The inventors have demonstrated that common pesticides such as clothianidin, thiacloprid and imidacloprid can be detected by the methods of the invention.

In some embodiments, the analyte(s) are peptides or other biomarkers. The detection of biomarkers as indicators of normal or abnormal biological processes is increasingly important in clinical diagnostics. Protein biomarkers can be particularly valuable as their functionality allows them to dynamically adapt to changing cell conditions. The measurement of such protein markers is often performed using immunoassays, although this approach has a number of limitations. Quantitative immunoassay techniques can be affected by other compounds within the sample matrix, leading to a reduction in specificity and the ability to detect protein variants. Mass spectrometry is now a practical alternative to immunoassays due to advances in sample preparation and instrumentation. High-throughput analysis is critical when analysing large numbers of clinical samples and allows the data processing of biomarkers to occur in a parallel manner. The inventors have demonstrated the effectiveness of the invention in detecting nine different health biomarker peptides used for cellular processes, with molecular weights ranging from 757 Da to 3147 Da.

In some embodiments, the analyte(s) are explosive or firearm residues. For example, these residues when present on the surface of an object (such as a fingertip) may be detected by contacting the surface with the substrates of the invention.

Once the substrate has been contacted with the fluid or object to transfer analytes of interest onto the porous surface, the substrate is subjected to analysis by mass spectrometry to detect the analytes if present.

In some embodiments, the mass spectrometry analysis uses desorption-ionisation techniques, and in particular a laser-desorption-ionisation (LDI) technique. In some embodiments, UV laser desorption-ionisation is used, for example as performed using a conventional MALDI-TOF mass spectrometer. However other ionisation techniques are also envisaged and may be used in the methods of the invention to obtain one or more advantages, for example an excellent signal response. Such techniques include but are not limited to Desorption Electrospray Ionisation (DESI), Atmospheric Pressure Chemical Ionisation (APCI), Fast Atom Bombardment (FAB), Direct Analysis in Real-Time (DART).

Mass analysing techniques which may be suitable for performing the methods of the present disclosure include Time of flight (TOF), Quadrupole, Hybrid Quadrupole Orbitrap, Fourier transform (FT), Linear Ion trap, Fourier Transform Ion Cyclotron Resonance (FTICR), Orbitrap, Quadrupole Time of Flight (Q-TOF). In TOF-MS, the sample ion is accelerated by a known voltage, and the time it takes a sample ion or fragment thereof to travel a known distance is measured. This data is then used to measure the mass of a sample molecule, as well as the mass of the fragments of a sample to identify that sample. Accordingly, the mass spectrometric technique that is used to detect the one or more target analyte(s) captured by the coated porous substrate may be SALDI-TOF-MS. Specifically, mass spectra can be collected using a mass spectrometer equipped with a pulsed laser in linear/reflectron and positive/negative modes. The laser attenuator offset used may depend on the target analyte (s) to be measured and the optimal offset for a specific analyte can be determined by the skilled person. In some embodiments mass spectroscopy imaging can be used in analysis of tissue samples or extracts.

Kit

The invention also relates to a kit comprising the coated substrate as disclosed herein, in particular in the form of a chip, and a chip holder configured to be inserted into a mass spectrometer.

Sample plate holders are generally supplied as standard items with every MS instrument. These plate holders, while varying between different instruments due to the specifications of the manufacturer, are generally configured to receive standard sample substrates. Therefore, in order to use the coated substrates of the present invention in any particular instrument, a bespoke chip holder which is tailor-made both to receive the coated substrate, for example milled to the exact chip specifications, and to be inserted into a target MS instrument to be used, may be required. It is thus envisaged that the coated substrates may be supplied in a kit together with a chip holder as required to facilitate the analysis.

EXAMPLES

The present invention is described with reference to the following examples. It is to be understood that the examples are illustrative of and not limiting to the invention described herein.

Materials

Hydrofluoric acid (HF) (48%) was purchased from Chem-Supply (SA, Australia). HPLC grade ethanol (≥99.9%), isopropanol (≥99.8%), acetone (≤100%), acetonitrile (≥99.9%), and chloroform (≥99.8%) were purchased from Merck (Darmstadt, Germany). HPLC grade water was purchased from Fisher Chemical (PA, USA). (Pentafluorophenyl)propyl-dimethylchlorosilane ($F_5PhPr$) was purchased from Gelest Inc. (PA, USA.).

A peptide calibration mixture consisting of bradykinin 1-7, angiotensin I, angiotensin II, substance P, bombesin, renin substrate, ACTH clip 1-17, ACTH clip 18-39 and somatostatin 28 was purchased from Bruker-Daltonics (Germany).

Certified standard solutions of cocaine, 3,4-methylenedioxymethamphetamine (MDMA), methamphetamine (MA), morphine and tetrahydrocannabinol (THC), and their respective deuterated internal standards were obtained from Novachem (VIC, Australia).

Example 1

Porous silicon (pSi) surfaces to be used for DIOS-MS analysis were prepared using monocrystalline (0.008-0.02 $\Omega \cdot cm$, 500-550 µm thickness) phosphorus doped n-type Si (100) wafers (Siltronix Silicon Technologies, Archamps, France) fabricated by light-assisted anodic etching in a 25% v/v HF/ethanol electrolyte solution. A constant current of 2.24 $mA/cm^2$ was applied across the cell for 3 min using a Keithley 2460 current source meter (Tektronix, Inc., OR, USA), and the illumination was provided by a LCD cold light source with 3300 K white light transmitted, using a series of lenses to collimate the light. The pSi chips were then rinsed rigorously with ethanol and dried under nitrogen gas. The freshly etched pSi was ozone-oxidised at a flow rate of 5 $g/m^3$ at 0.5 L/min oxygen for 30 min by use of a UV-1 UV-ozone cleaner (SAMCO Inc., Kyoto, Japan). Subsequently, the pSi was subjected to a second pore broadening etch with 5% $HF/H_2O$ for 60 s. The double-etched surface was ozone-oxidised (as above) for a second time.

Imaging of the DIOS surface was performed using a Nova NanoSEM 430 (FEI, Hillsboro, Oreg., USA) operated at an accelerating voltage of 10 kV and a working distance of 5 mm.

Figure 2:
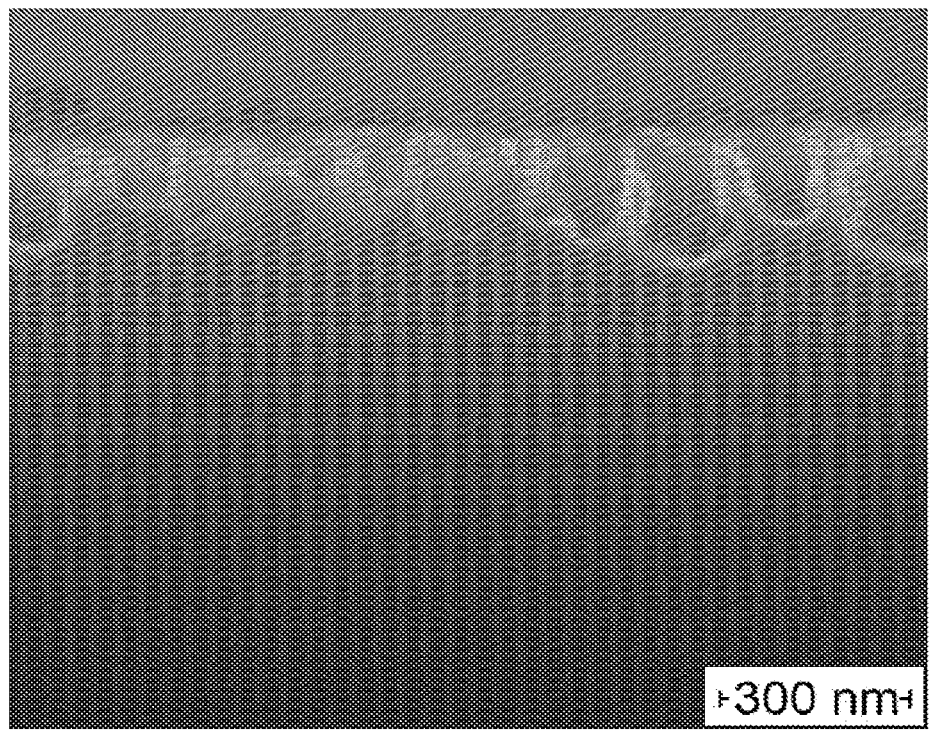
FIG. 2 depicts scanning electron microscopy (SEM) images of pSi substrates, as produced in Example 1, in cross-sectional side view.

Scanning electron microscopy (SEM) images of pSi substrates are depicted in plan view in FIG. 1 and cross-sectional side view in FIG. 2. The pore dimensions were calculated using ImageJ 1.51r using the segmented line tool. The images and calculations show that homogeneous pores with a diameter of $100\pm14$ nm and a depth of $212\pm33$ nm were produced using the using light-assisted anodic etching.

Example 2

The hydroxyl-terminated surfaces of the pSi surfaces produced in Example 1 were then functionalised using either silane chemistry or plasma polymerisation coating. Silanization was performed by directly depositing 90 µL of $F_5PhPr$ on the substrate and leaving at 80° C. in an oven for 60 min. The surfaces were then washed with acetone and dried under high purity $N_2$ gas.

Plasma polymerisation coating of the pSi surface was performed using a Plasmalab System 100 (DRIE) instrument (Oxford Instruments, Abingdon, United Kingdom). The substrate was mounted in the chamber and fluorinated gas (one or more of $C_4F_8$, $CF_4$, and $CHF_3$) was pumped through the system with the following parameters independently controlled: variable flow rate (0-200 standard cubic centimeter per minute (sccm)), coating time (2-40 s), chamber pressure (1-100 millitorr (mTorr)), inductively couple plasma (ICP) forward power (0-3000 W) and radio frequency (RF) power (0-600 W).

Example 3

X-ray photoelectron spectroscopy (XPS) analysis of the pSi surfaces, before and after functionalisation as described in Example 2, was performed using an AXIS Ultra DLD spectrometer (Kratos Analytical Inc., Manchester, UK) with a monochromated Al Kα source at a power of 180 W (15 kV*12 mA), a hemispherical analyser operating in the fixed analyser transmission mode and the standard aperture (analysis area: 0.3 mm×0.7 mm) The total pressure in the main vacuum chamber during analysis was typically between $10^{-9}$ and $10^{-8}$ mbar. Survey spectra were acquired at a pass energy of 160 eV. To obtain more detailed information about chemical structure, oxidation states etc., high resolution spectra were recorded from individual peaks at 40 eV pass energy.

Data processing was performed using CasaXPS processing software version 2.3.15 (Casa Software Ltd., Teignmouth, UK). All elements present were identified from survey spectra. The atomic concentrations of the detected elements were calculated using integral peak intensities and the sensitivity factors supplied by the manufacturer. Binding energies were referenced to the C 1s peak at either 285.0 eV (aliphatic hydrocarbon).

Figure 3:
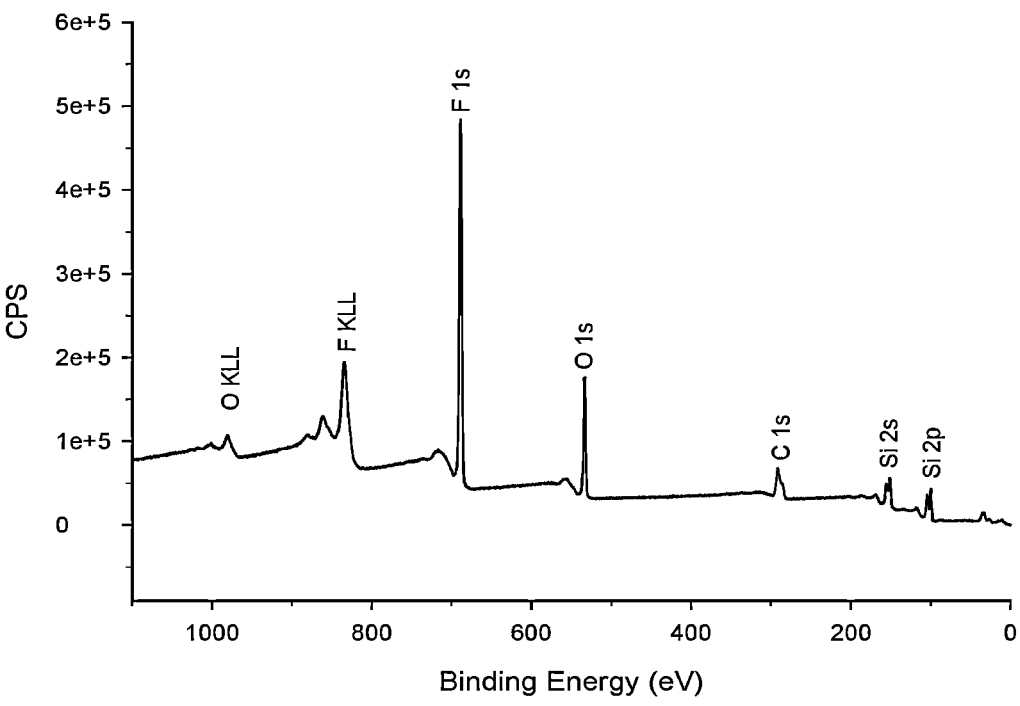
FIG. 3 depicts X-ray photoelectron spectroscopy (XPS) survey spectra of a pSi surface coated with fluorocarbon plasma polymer, as produced in Example 2.

The survey spectra showed the presence of surface oxygen following oxidation via UV-ozone (per Example 1). The presence of fluorine and a reduction in surface oxygen was observed following surface functionalisation using fluorinated gases, as seen in FIG. 3. Trace amounts of hydrocarbon were also observed on the oxidised surface.

Figure 4:
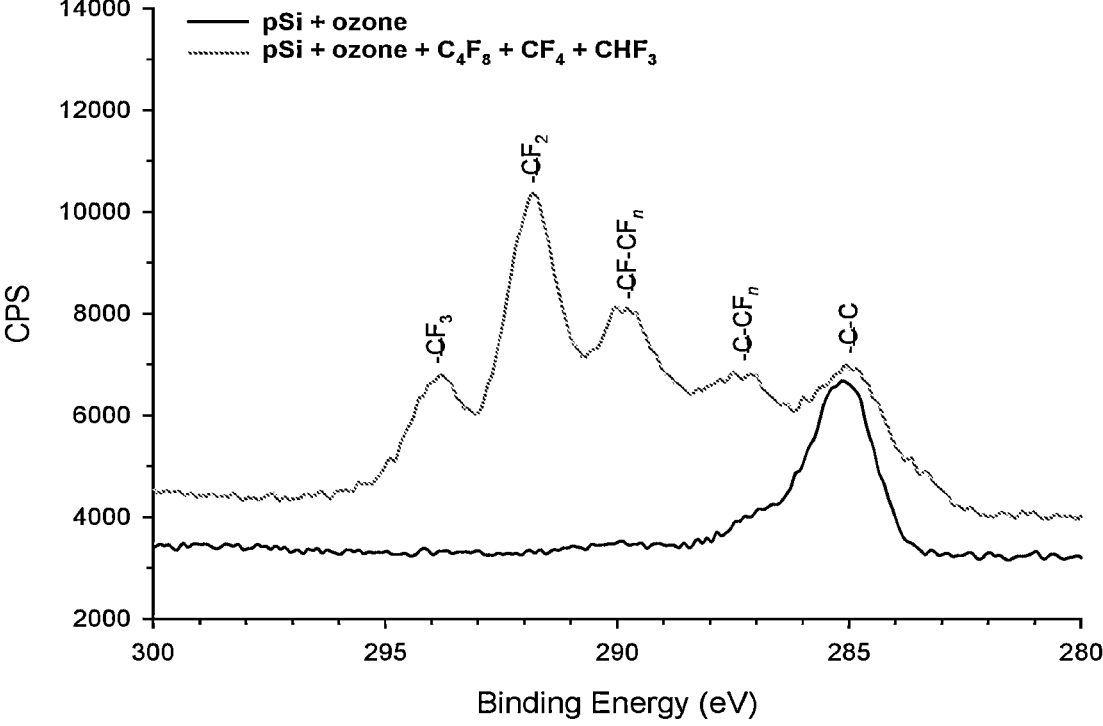
FIG. 4 depicts high resolution C1s X-ray photoelectron spectroscopy (XPS) spectra of a pSi surface coated with fluorocarbon plasma polymer, as produced in Example 2.

The high-resolution C1s spectra of both surface oxidised and plasma polymer coated pSi surfaces, using a mixture of $C_4F_8$, $CF_4$, and $CHF_3$ gases, is shown in FIG. 4. The C1s spectra of the coated pSi substrate was resolved into five different components at binding energies of 293.8 eV (—$\underline{C}F_3$), 291.8 eV (—$\underline{C}F_2$), 290.0 eV (—$\underline{C}F$—$CF_n$), 287.5 eV ($\underline{C}F$—$CH_n$ and —$\underline{C}$—$CF_n$), and 285.0 eV ($\underline{C}$—$C$) respectively. The additional presence of carbon-oxygen species cannot be excluded, considering the presence of oxygen on the surface. The carbon peak at 285 eV detected on the oxidised surface is assumed to be hydrocarbon residue. The various fluorocarbon components present were a result of the defragmentation of $C_4F_8$, $CF_4$ and $CHF_3$ during the functionalisation process.

Figure 5:
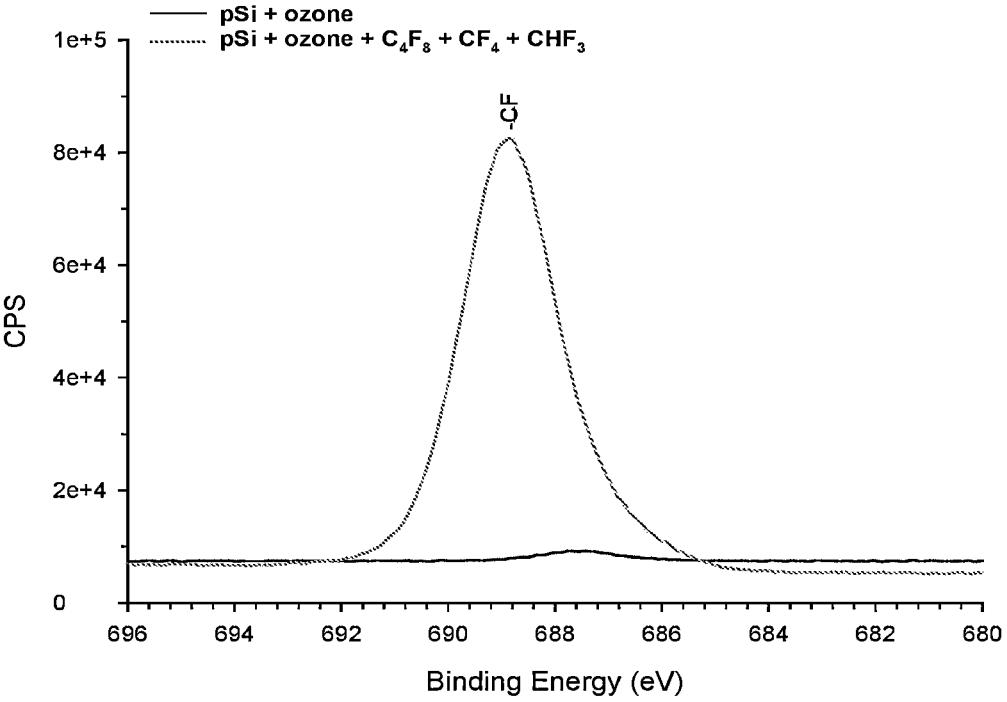
FIG. 5 depicts F1s X-ray photoelectron spectroscopy (XPS) spectra of a pSi surface coated with fluorocarbon plasma polymer, as produced in Example 2.

The F1s spectra of both surface oxidised and plasma polymer coated pSi surfaces, using $C_4F_8$, $CF_4$, and $CHF_3$ gases, is shown in FIG. 5. The major peak, observed at a binding energy of 688.9 eV, is similar to the value previously reported for fluorocarbon films with PTFE-like properties and was therefore attributed to the —$CF_2$—$CF_2$—$CF_2$ fluorine environment. The high intensity of the —CF component was consistent with the higher elemental fluorine content, in atomic percentage, of the DRIE functionalised substrate as expected following functionalisation using fluorinated gases when compared with only an ozone-oxidised substrate (Table 1).

TABLE 1

| Surface treatment | Elements (%) | | | | |
|---|---|---|---|---|---|
| | Si | O | C | F | N |
| Ozone oxidised (Example 1) | 35.1 | 55.7 | 8.0 | 1.1 | 0.1 |
| Plasma polymer coated (Example 2) | 22.6 | 15.2 | 22.9 | 39.2 | 0.0 |

Example 4

The water contact angle (WCA) of the pSi surfaces, before and after functionalisation as described in Example 2, was measured with a contact angle goniometer using a Super Dynamic wv-BP550 camera (Panasonic, Yokohama, Japan) and USB DVR software version 2.0. The WCA method was based on the Cassie-Baxter (CB) model for wetting of a heterogenous surface determined using 1 μL of water, analysed in triplicate, under ambient conditions. WCA analysis was performed using ImageJ software version 1.50e (National Institutes of Health, USA).

The wettability of the functionalised pSi surfaces was thus assessed using the water contact angle (WCA). A hydrophobic surface is optimum for DIOS analysis as it allows for the beading of aqueous samples which thus stay localised to a relatively small area. Surface hydrophobicity will increase in the presence of low surface energy components, including —$CF_3$ and —$CF_2$. This was apparent when measuring and comparing the WCA of the ozone-oxidised (post Example 1) and plasma polymer coated (post Example 2) surfaces. The WCA of the coated surface was found to be 114°±2° while the ozone oxidised surface had a WCA of 43°±6°. The hydrophobic nature of the coated surface was ascribed to the high concentrations of low surface energy components (—$CF_3$ and —$CF_2$), as evident from the XPS analysis.

Example 5

The thickness of the surface coatings was determined using a M-2000DI spectroscopic ellipsometer (J.A. Woollam Co., USA). Measurements of Ψ and Δ were performed at a continuous wavelength range between 200-1700 nm under incident angles of 60, 65, 70 and 75°. Data analysis was performed using CompleteEASE Version 4.92 (J.A. Woollam Co., Inc., NE, USA).

Figure 6:
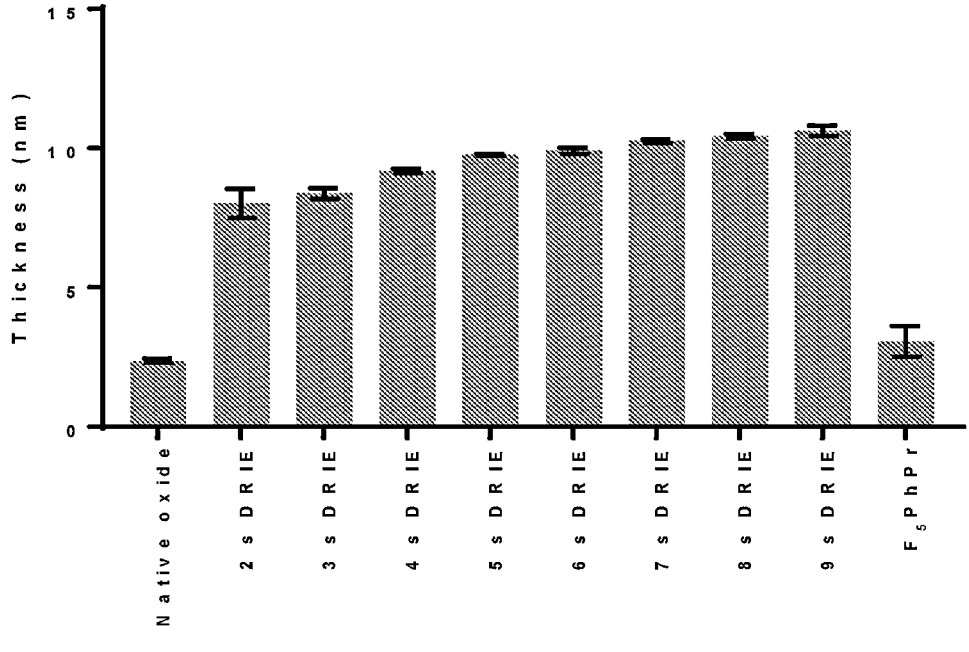
FIG. 6 is a graph showing the effect of increasing fluorocarbon plasma coating time on the thickness of the deposited coating, as investigated in Example 5.

The thickness of the small-molecule silane functionalised layer and the fluorocarbon plasma polymer coatings of the pSi substrate produced in Example 2 was thus measured via variable-angle spectroscopic ellipsometry, using the non-fluorinated oxidised pSi precursor substrate as a control. FIG. 6 illustrates the effect of increasing the fluorocarbon coating time, ranging from 2-9 s, on the thickness of the deposited layer. The errors bars represent the standard deviation (n=3). The results show that a coating was substantially laid down within two seconds but that longer coating times led to some increase in thickness. There was a minimal increase in layer thickness following a coating of 7 s and greater, leading to the appearance of a plateau. It is believed that deposition of the fluorocarbon species occurs initially at a fast rate due to the large number of reactive species on the $SiO_2$ surface. Once a substantially saturated layer is formed, a slower deposition rate then occurs due to the lower likelihood of fluorocarbon chemisorption.

In all cases, the thickness of the fluorocarbon plasma polymer layer (8.0-10.6 nm) was significantly greater than the layer formed using $F_5PhPr$ silane chemistry (3.1 nm). However, the plasma polymer thickness is much thinner than the pore dimensions and it is evident from SEM analyses that the polymer forms a coating on the pore walls but does not fill the pores.

Example 6

Solutions of cocaine were prepared by diluting the contents of each certified ampoule to form stock solutions of 10 μg/mL in HPLC grade water with a solution volume of 1 mL. Working solutions of 1000 ng/mL and 100 ng/mL were obtained by diluting the stock solutions with HPLC grade water. Working solutions were kept at 4° C. and prepared fresh each analysis day. Illicit drug solutions at varying concentrations (1-100 ng/mL in water) containing the deuterated internal standard, cocaine-d3 at 50 ng/mL, were prepared from the working solutions immediately prior to analysis.

Aliquots of drug solutions (1 μL) were deposited on the pSi surfaces in triplicate using 0.1-10 μL Eppendorf epT.I.P.S. pipette tips attached to an Eppendorf Research Plus pipette (Hamburg, Germany). The deposited solutions were allowed to evaporate completely. Upon evaporation, the pSi surfaces were mounted on a custom modified MALDI target plate (MTP384, Bruker Daltonics, Bremen, Germany) using double sided conductive tape and analysed.

Mass spectra were collected using a MALDI-TOF-TOF ultrafleXtreme Series mass spectrometer (Bruker, Billerica, Mass., USA) equipped with a smartbeam-II (355 nm, neodymium-doped yttrium aluminium garnet (Nd:YAG)) 1 kHz pulsed laser, operated at 1 kHz frequency in reflectron positive (RP) mode. The laser attenuator was manually set by the operator based on the age and response of the pulsed laser. Mass spectra were generated by averaging 2500 individual laser shots. Data acquisition was performed used flexControl 3.4 (build 135) software and data analysis using flexAnalysis version 3.4 (build 50). Instrumental parameters for the RP acquisition were set as follows: 25.00 and 22.60 kV for ion sources 1 and 2, respectively, 7.5 kV for the lens and 26.50 and 13.45 kV for reflectors 1 and 2, respectively. External calibration of the TOF tube was performed before acquisition on the monoisotopic masses of Caesium iodide (CsI) adducts, namely Cs (132.91 Da), Cs2I (392.72 Da) and (CsI)2Cs (652.53 Da).

Figure 7:
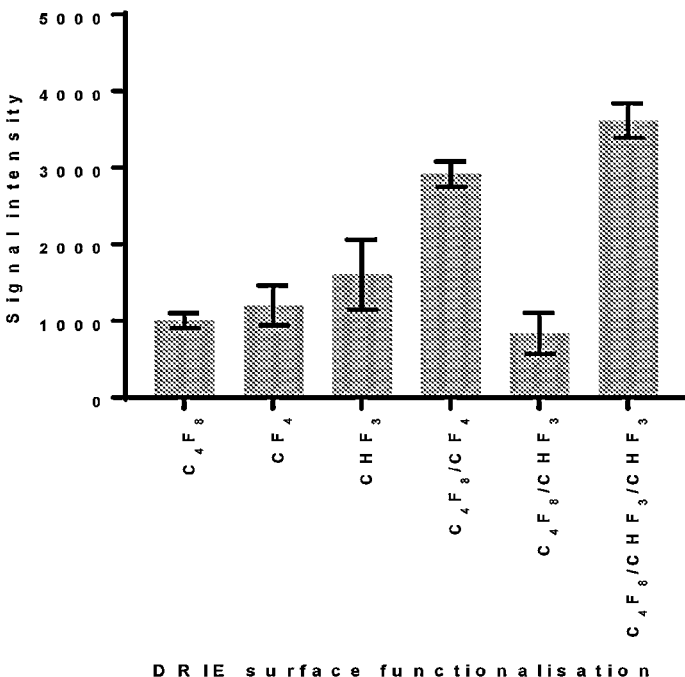
FIG. 7 is a graph showing the signal intensity of a cocaine analyte in DIOS-MS analysis using substrates coated with plasmas produced from a variety of different fluorocarbon gas mixtures, as investigated in Example 6.

The effect of different precursor fluorinated gases on the fluorocarbon layer properties was investigated. FIG. 7 depicts the performance of the polymer layers produced from various gases using the signal intensity of cocaine in the DIOS-MS analysis (100 ng/mL, averaged using 2500 shots of spectra). The gases available on the DRIE instrument ($C_4F_8$, $CF_4$, $CHF_3$) were used separately or in conjunction with $C_4F_8$ to produce a hydrophobic fluorocarbon plasma polymer-coated surface for mass spectrometry. All other parameters (coating time, chamber pressure, inductively couple plasma (ICP) forward power and radio frequency (RF) power) were kept constant with the exception of the gas flow rate which was modified based on preliminary surface performance experiments. Good signal intensities were obtained in all cases, although statistical analysis found that surfaces coated using a combination of $C_4F_8$, $CF_4$, and $CHF_3$ had a significantly higher cocaine signal intensity in comparison to other gases/gas combinations.

Using the mixture of $C_4F_8$, $CF_4$, and $CHF_3$ gases, the effect of other parameters available on the instrument, including gas flow rate, coating time, chamber pressure, inductively couple plasma (ICP) forward power and radio frequency (RF) power, were also investigated using the observed cocaine signal intensity. Comparisons were made in each case with a control where the surface was functionalised using instrument defined default conditions (gas flow 150 sccm, chamber pressure 17 mTorr, ICP forward power 1000 W, RF forward power 0 W and coating time 30 s).

Figure 8:
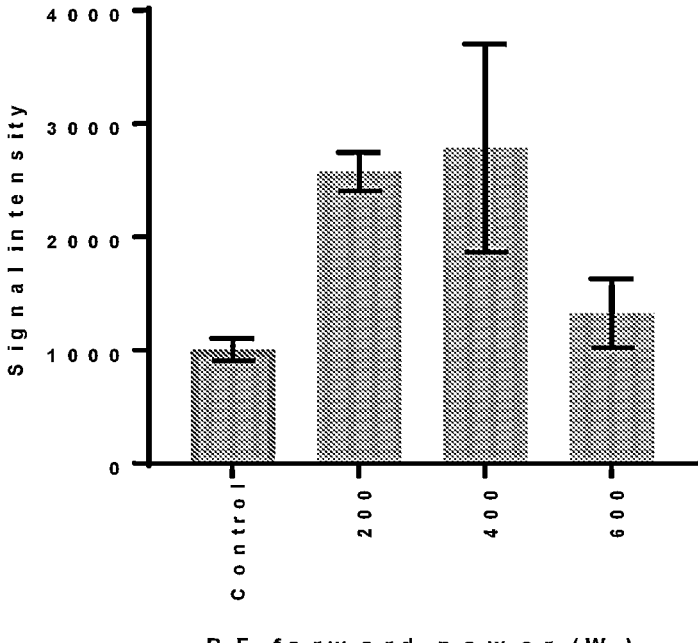
FIG. 8 is a graph showing the signal intensity of a cocaine analyte in DIOS-MS analysis using substrates coated with fluorocarbon plasmas generated at different RF forward power values, as investigated in Example 6.
Figure 9:
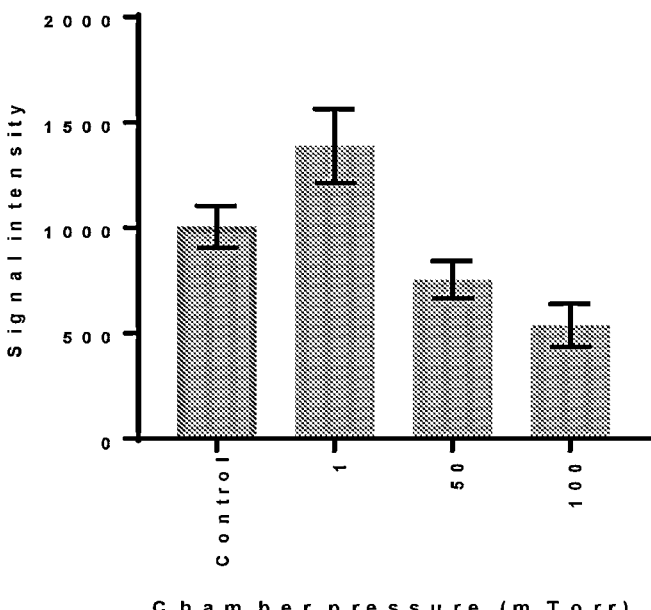
FIG. 9 is a graph showing the signal intensity of a cocaine analyte in DIOS-MS analysis using substrates coated with fluorocarbon plasma at a variety of different deposition pressures, as investigated in Example 6.

The performance of the functionalised substrate was found to be dependent on the density of the generated plasma. A high plasma density resulted in a better performing surface, as evident by the significantly higher signal intensity of cocaine when increasing the RF forward power (seen in FIG. 8; control=0 W) and decreasing the chamber pressure (seen in FIG. 9; control=17 mTorr), both parameters that directly impact plasma formation.

Figure 10:
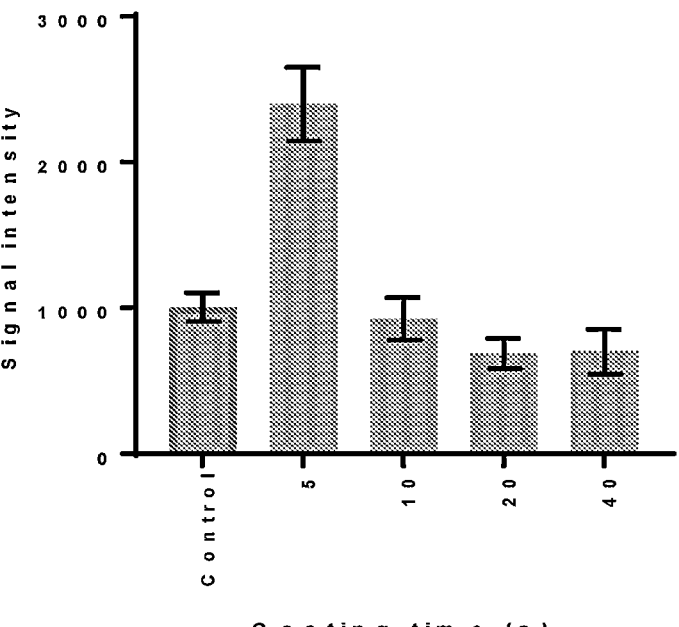
FIG. 10 is a graph showing the signal intensity of a cocaine analyte in DIOS-MS analysis using substrates coated with fluorocarbon plasma for a variety of different deposition contact times, as investigated in Example 6.

The effect of coating times is depicted in FIG. 10. Shorter times (about 5 seconds) were found to produce a higher signal than longer times (10 seconds and longer). Gas flow rates of 50-200 sccm produced the highest signal intensity for cocaine when the coating time was less than 10 s.

Figure 11:
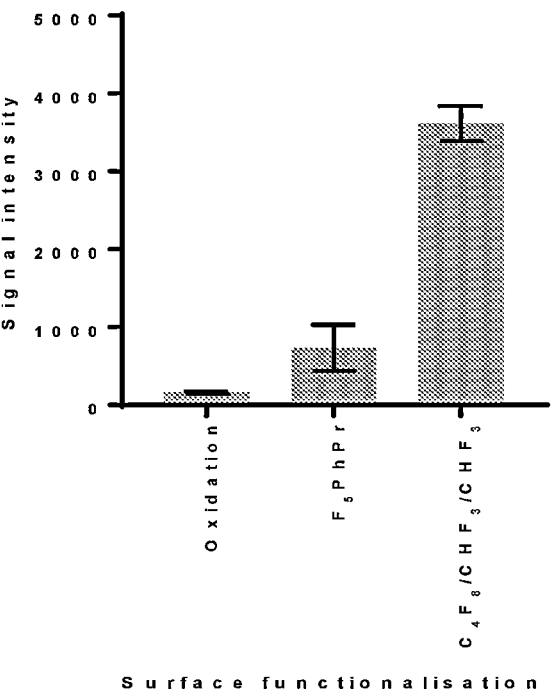
FIG. 11 is a graph showing the signal intensity of a cocaine analyte in DIOS-MS analysis using an optimised fluorocarbon plasma-coated substrate compared to a wet-chemical silanized substrate and an unmodified substrate, as investigated in Example 6.

The optimised conditions thus determined are as follows: gas precursors $C_4F_8$, $CF_4$, and $CHF_3$ at gas flows of 200, 50 and 100 sccm respectively, chamber pressure 70 mTorr, ICP forward power 3000 W, RF forward power 400 W and coating time 8 s. A comparison of the pSi substrate thus functionalised with a pSi substrate surface functionalised using $F_5PhPr$ and an unmodified (post-Example 1) pSi substrate is shown in FIG. 11 using cocaine (100 ng/mL). The optimised fluorocarbon plasma polymer coated substrate performed over 4.5 times better than the small molecule silanised substrate and over 22 times greater than the unmodified oxidised substrate.

Figure 12:
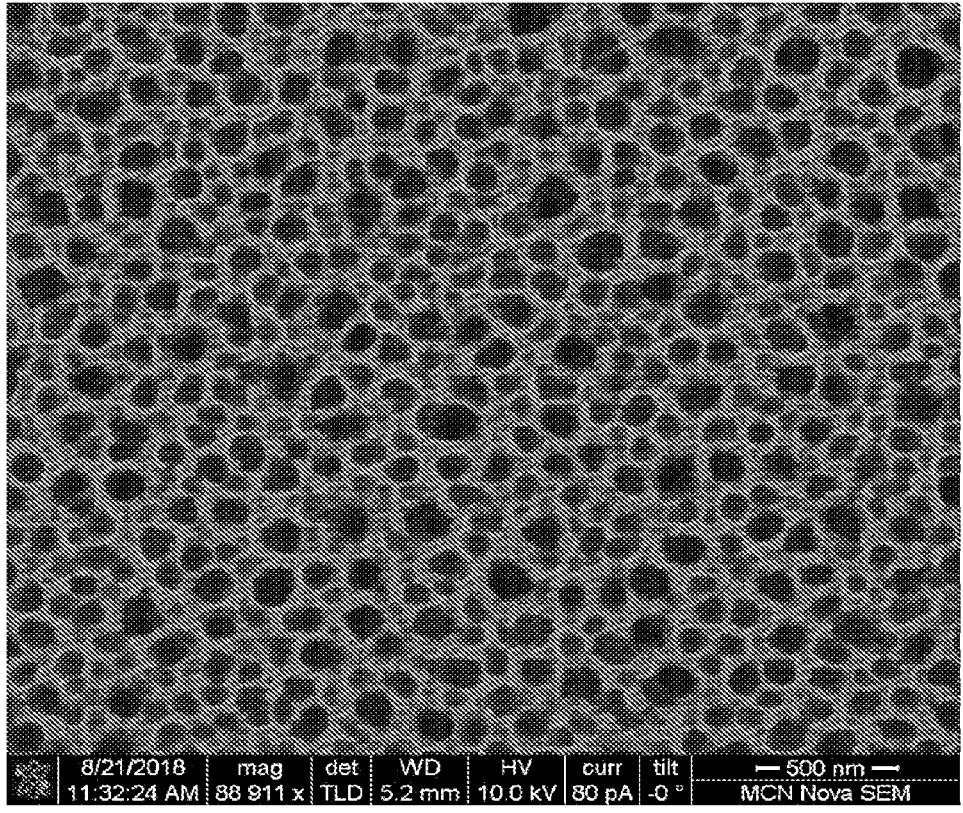
FIG. 12 depicts scanning electron microscopy (SEM) images of pSi substrates coated with fluorocarbon plasma polymer, as produced in Example 6, in median plan view.
Figure 13:
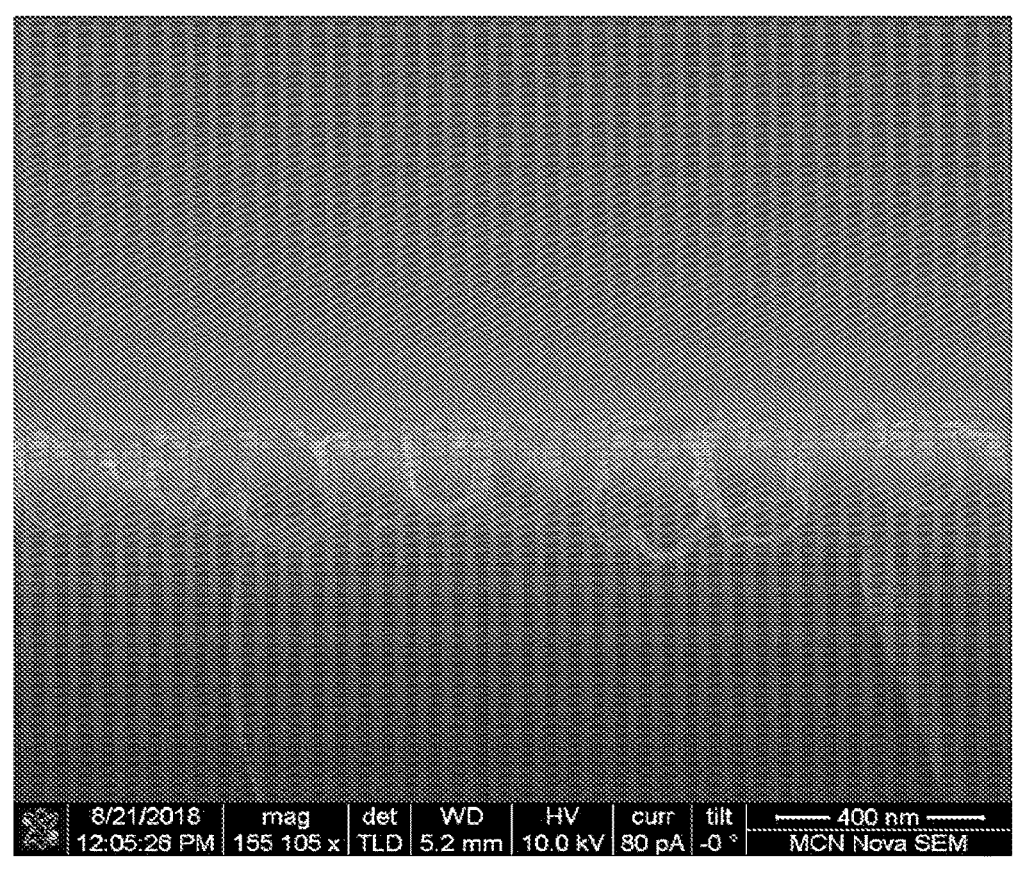
FIG. 13 depicts scanning electron microscopy (SEM) images of pSi substrates coated with fluorocarbon plasma polymer, as produced in Example 6, in cross-sectional side view.

Scanning electron microscopy (SEM) images of the optimised fluorocarbon polymer-coated pSi substrates are depicted in plan view in FIG. 12 and cross-sectional side view in FIG. 13. It is evident that the coating did not fill or block the pores but rather formed a thin coating which conforms to the pore walls.

Example 7

Figure 14:
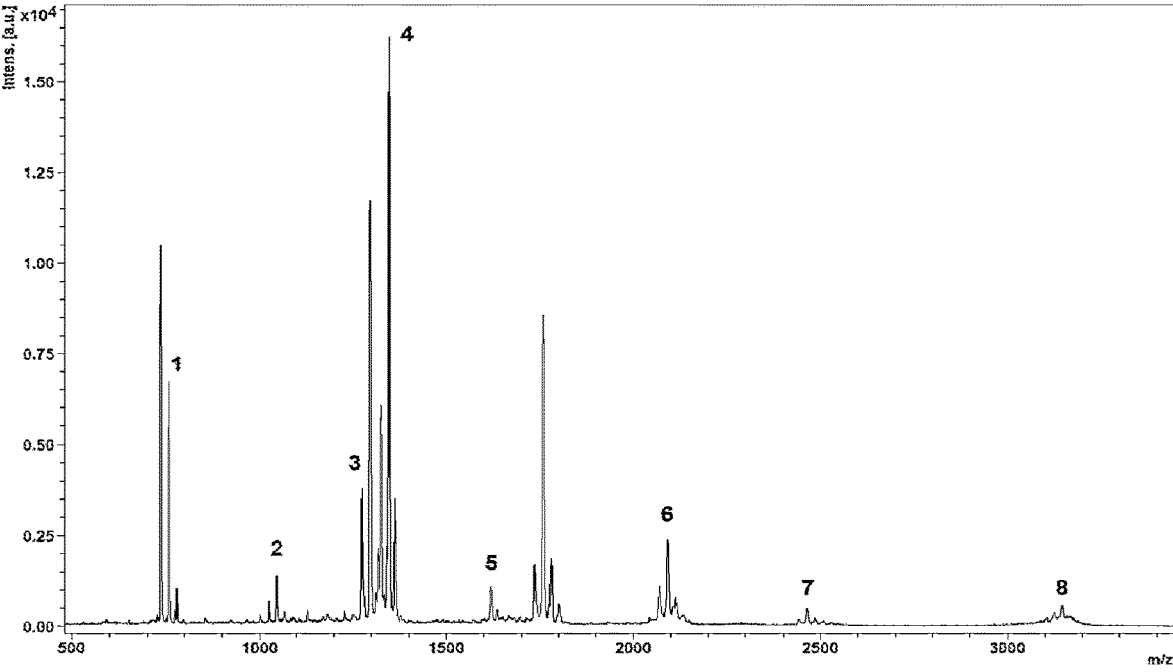
FIG. 14 is a SALDI mass spectrum of a sample mixture containing nine different peptides retained on a fluorocarbon plasma polymer-coated pSi substrate, as measured in Example 7.

A sample mixture containing biologically important peptides was deposited on a fluorocarbon plasma polymer-coated pSi substrate optimised as described in Example 6. FIG. 14 shows a representative mass spectrum of a sample mixture containing nine different peptides: (1) bradykinin 1-7, (2) angiotensin II, (3) angiotensin I, (4) substance P, (5) bombesin, (6) renin substrate, (7) ACTH clip 1-17, (8) ACTH clip 18-39, and (9) somatostatin 28. All the analytes, with molecular ion weights ranging from 757 Da (bradykinin 1-7) to 3147 Da (somatostatin 28), were clearly observed. The simultaneous detection of eight peptides demonstrated that the fluorocarbon polymer-coated pSi substrates are conducive to multi-analyte analysis of biomarker peptides.

Figure 15:
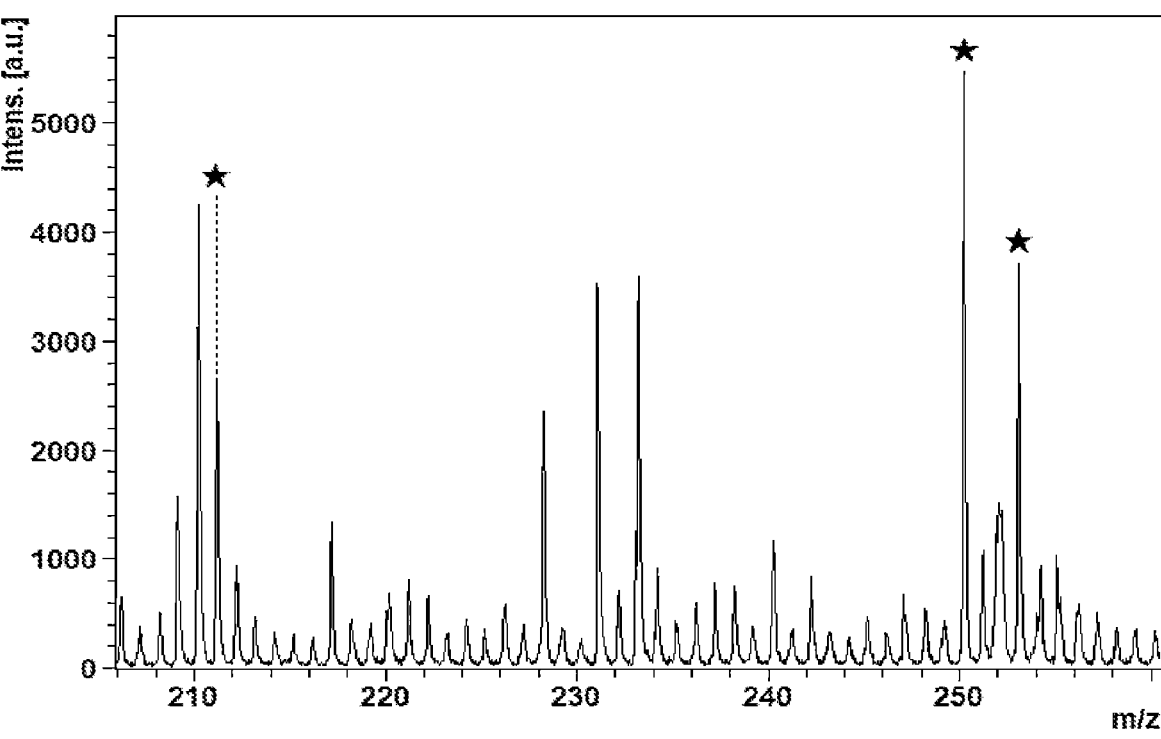
FIG. 15 is a SALDI mass spectrum of a sample mixture containing three different pesticides retained on a fluorocarbon plasma polymer-coated pSi substrate, as measured in Example 7.

The analysis of multiple analytes simultaneously on the same substrate was further evaluated using a range of pesticides. A mixture containing imidacloprid, clothianidin and thiacloprid, three common pesticides present in the agriculture industry, was formulated at a constant concentration of 1 μg/mL for each analyte. As seen in FIG. 15, the parent peaks of clothianidin (m/z=250) and thiacloprid (m/z 252) were clearly detected while desnitro-imidacloprid (m/z=211), a metabolite of imidacloprid, also showed a high signal intensity.

Figure 16:
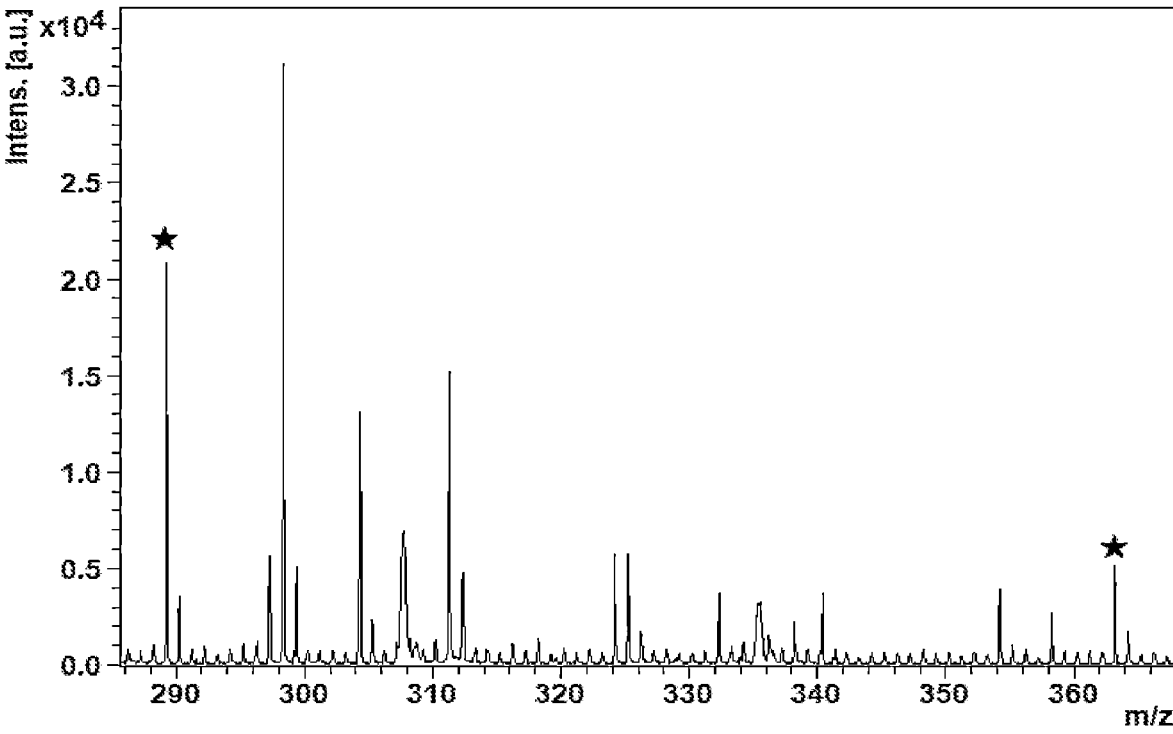
FIG. 16 is a SALDI mass spectrum of a sample mixture containing two different steroids retained on a fluorocarbon plasma polymer-coated pSi substrate, as measured in Example 7.

The presence of testosterone (m/z=289) and cortisol (hydrocortisone) (m/z=363), steroids commonly involved in cases of athlete doping, were also simultaneously detected at concentrations of 500 μg/mL, as seen in FIG. 16.

Figure 17:
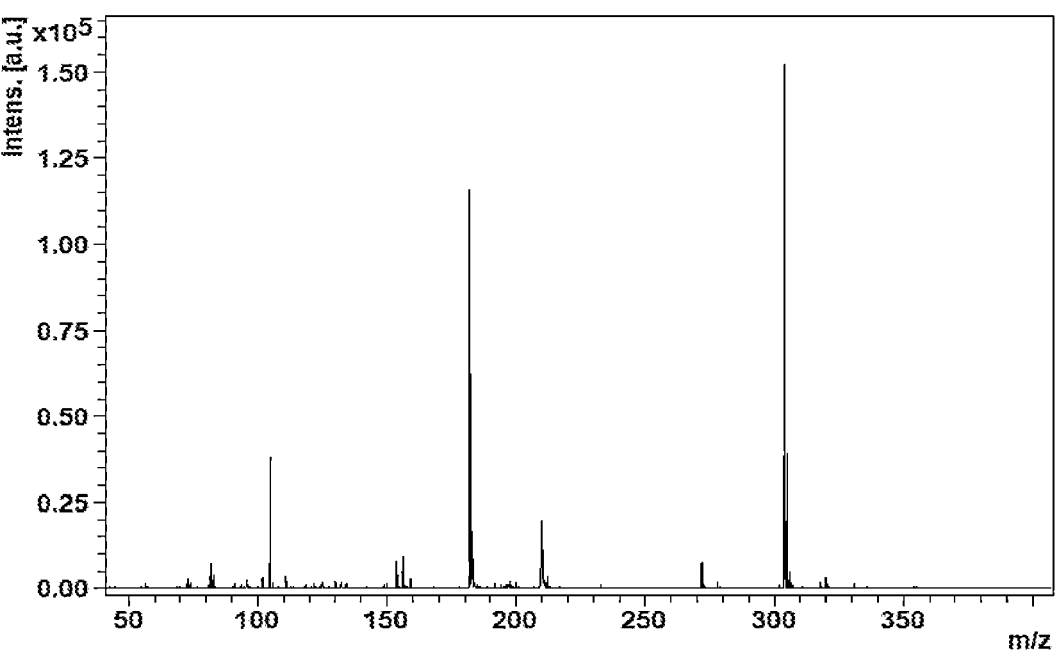
FIG. 17 is a SALDI mass spectrum of a sample containing cocaine retained on a fluorocarbon plasma polymer-coated pSi substrate, as measured in Example 7.

A representative DIOS mass spectrum for cocaine in water (100 ng/mL) obtained on the same substrate is shown in FIG. 17. The major peak for cocaine (m/z=304) was observed along with a fragment peak (m/z=182) corresponding to the loss of $C_6H_5CO_2$ from the cocaine molecule.

Example 8

Figure 18:
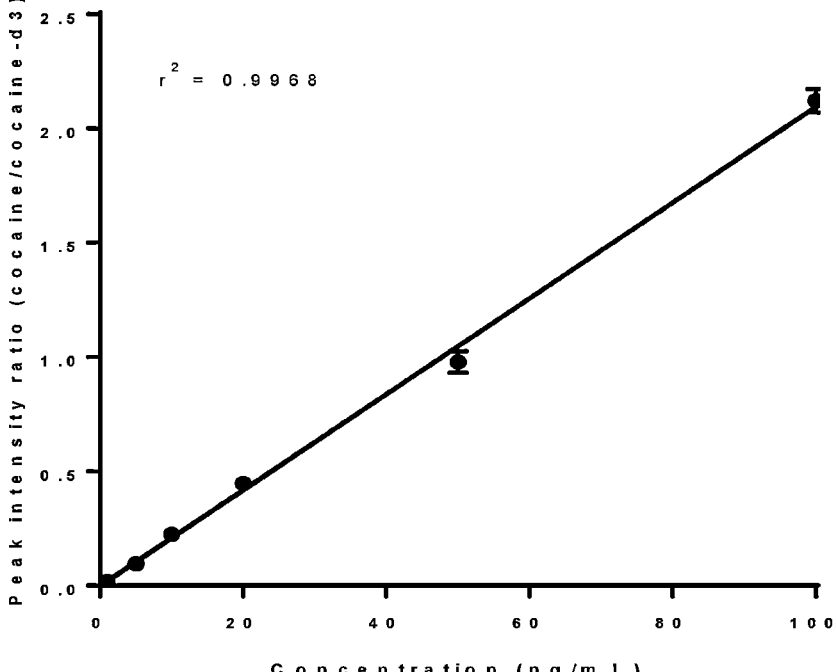
FIG. 18 is a linear regression curve of the measured signal intensity of cocaine in aqueous samples of known concentration, relative to a deuterated cocaine internal standard, as measured by SALDI-MS in Example 8.

Cocaine in water samples with different concentrations in the range of 1-100 ng/mL, with 50 ng/mL cocaine-d3 internal standard, were deposited on the optimised fluorocarbon plasma polymer-coated pSi substrate as described in Example 6. A linear regression curve, as seen in FIG. 18, was plotted using the measured signal intensity for the cocaine peak relative to the internal standard. The limit of detection (LOD) and the limit of quantification (LOQ) for cocaine in water was determined to be 1.24 and 2.76 ng/mL, respectively, over a concentration range of 1-100 ng/mL with excellent linearity (<0.99).

The limit of detection (LOD) and limit of quantification (LOQ) were calculated using three and ten standard deviations (SD), respectively, above the observed background measured in the mass region corresponding to the mass of cocaine when only the internal standard, cocaine-d3, was present. Eighteen blank replicates containing only the internal standard over three pSi substrates were used to calculate the LOD and LOQ.

Example 9

Oral fluid is a complex mixture comprising normal human plasma constituents, oral cavity microbes, secretions from the nasopharynx, and food particles that may be present. When deposited on a DIOS surface using the dried droplet sample deposition method, saliva forms a thick crusted layer that prevents the desorption and ionisation of molecules of interest. Using a solvent extraction protocol previously reported by Guinan et al. *Drug testing and analysis* 2017 9(5) 769-77, the crust layer was avoided and reproducible analyses could be performed.

Oral fluids were obtained according to the European Workplace Drug Testing Society guidelines from a drug and smoke-free volunteer and stored at 4° C. before use for no longer than 1 week (31). 200 μL of neat saliva samples was spiked with a solution containing both drug and internal standard to give a final concentration in the range 1-100 ng/mL for cocaine and 50 ng/mL for the internal standard (cocaine-d3). Chloroform (40 μL) was subsequently added and the sample mixed by vortexing. 2 μL of the chloroform phase was deposited on substrate in triplicate and allowed to dry.

Cocaine in spiked saliva was used to test the performance of the optimised fluorocarbon plasma polymer-coated pSi substrate as described in Example 6 using a real sample matrix. The DIOS mass spectra for cocaine in saliva (1-100 ng/mL) with the presence of an internal standard (cocaine-d3 at 50 ng/mL) showed as expected the major peak for cocaine (m/z=304) along with the prevalent cocaine fragment peak (m/z=182) and the peak for cocaine-d3 (m/z=307).

Figure 19:
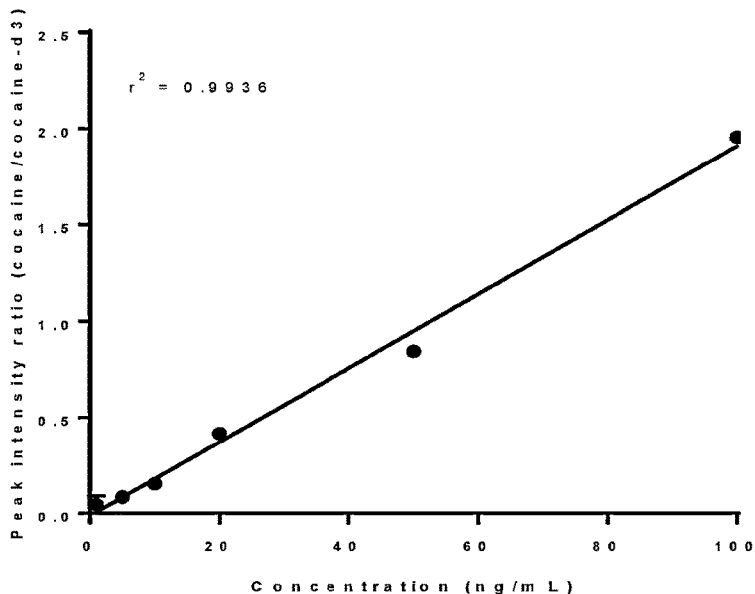
FIG. 19 is a linear regression curve of the measured signal intensity of cocaine in solvent extracted from saliva samples with known cocaine concentration, relative to a deuterated cocaine internal standard, as measured by SALDI-MS in Example 9.

A linear regression curve, as seen in FIG. 19, was plotted using the measured signal intensity for the cocaine peak relative to the cocaine-d3 internal standard. The LOD and LOQ for cocaine in saliva using this extraction method was determined to be 1.97 and 3.24 ng/mL over a concentration range of 1-100 ng/mL. Excellent linearity (<0.99) was again observed. The determined LOD for cocaine in saliva was lower than previously reported by Voelcker et al in *Talanta* 2012 99 791-8 for silane-functionalised DIOS substrates (3.79 ng/mL). The LOD for cocaine in saliva is also approximately 25 times lower than the cut-off limit outlined in Australian Standard AS4760, which is currently used for the confirmatory testing of drugs in oral fluid.

Example 10

The stability of fluorocarbon plasma polymer-coated pSi substrates was investigated over a 162-day period. Two separate studies were conducted using cocaine (100 ng/mL) in either water or saliva. The cocaine solutions were deposited on the functionalised surfaces, in replicates of nine on three different substrates, and stored in a closed Petri dish exposed to ambient air on a laboratory bench. The signal intensity of cocaine in DIOS-MS analyses as described in Example 6 was then monitored over the 162-day period and no significant decrease in signal was observed.

Example 11

The precision of DIOS surfaces functionalised per Example 2 using either (i) plasma polymerisation or (ii) wet chemical silanization was determined by calculating the relative standard deviation (RSD) of cocaine signal intensity using DIOS-MS. Intraday precision was calculated using the RSD values of three different surfaces analysed on the same day. Interday precision was calculated using RSD values over a 3-day period. The comparative results are shown in Table 2 below.

TABLE 2

|  | Plasma polymerisation | Silane wet chemical modification |
|---|---|---|
| Intraday % RSD | 6.0 | 13.4 |
| Interday % RSD | 11.8 | 28.4 |

Both the intraday and interday RSD was lower in the plasma polymer coated surfaces in comparison to surfaces functionalised using silane chemistry. DIOS functionalisation via plasma-polymerisation is a controlled process that is performed in industrial instruments, ensuring reproducibility between different surfaces. Conversely, silane functionalisation requires several manual handling processes, including silane deposition and washing, leading to an increase in surface-to-surface variability and a larger RSD value.

The precision for plasma polymer coated (RSD) was also calculated over a 162-day period (n=126) and determined to be 14.3%, showing little variability between surfaces over a long-term storage period and enhanced stability.

Example 12

Laser desorption ionisation-mass spectrometry (LDI-MS) was achieved directly from conductive surfaces by spotting a total of 1 μL onto electrochemically etched, porous-silicon semiconductor substrates coated using plasma polymerisation. MS and MS/MS detection was achieved using MALDI-tandem time-of-flight (TOF)-mass spectrometer (MALDI-7090, Shimadzu), operating in reflectron positive mode. The laser diameter was set to 50 μm and each spectra was the sum of 100 spectrum profiles using 100 laser shots per profile. Fragmentation experiments were achieved using a ±1.5 Da ion selection window and helium as the collision gas to generate collision induced dissociation (CID) spectra.

Figure 20:
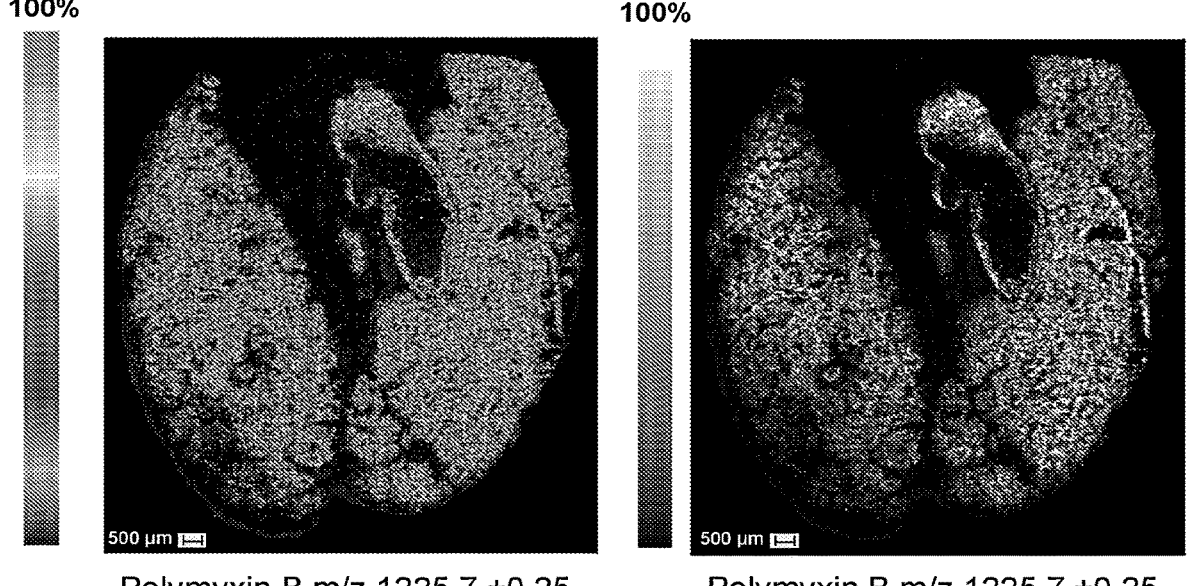
FIG. 20 is a mass spectrometry imaging of lung tissue on a porous silicon coated chip according to the current invention detecting polymyxin B.
Figure 21:
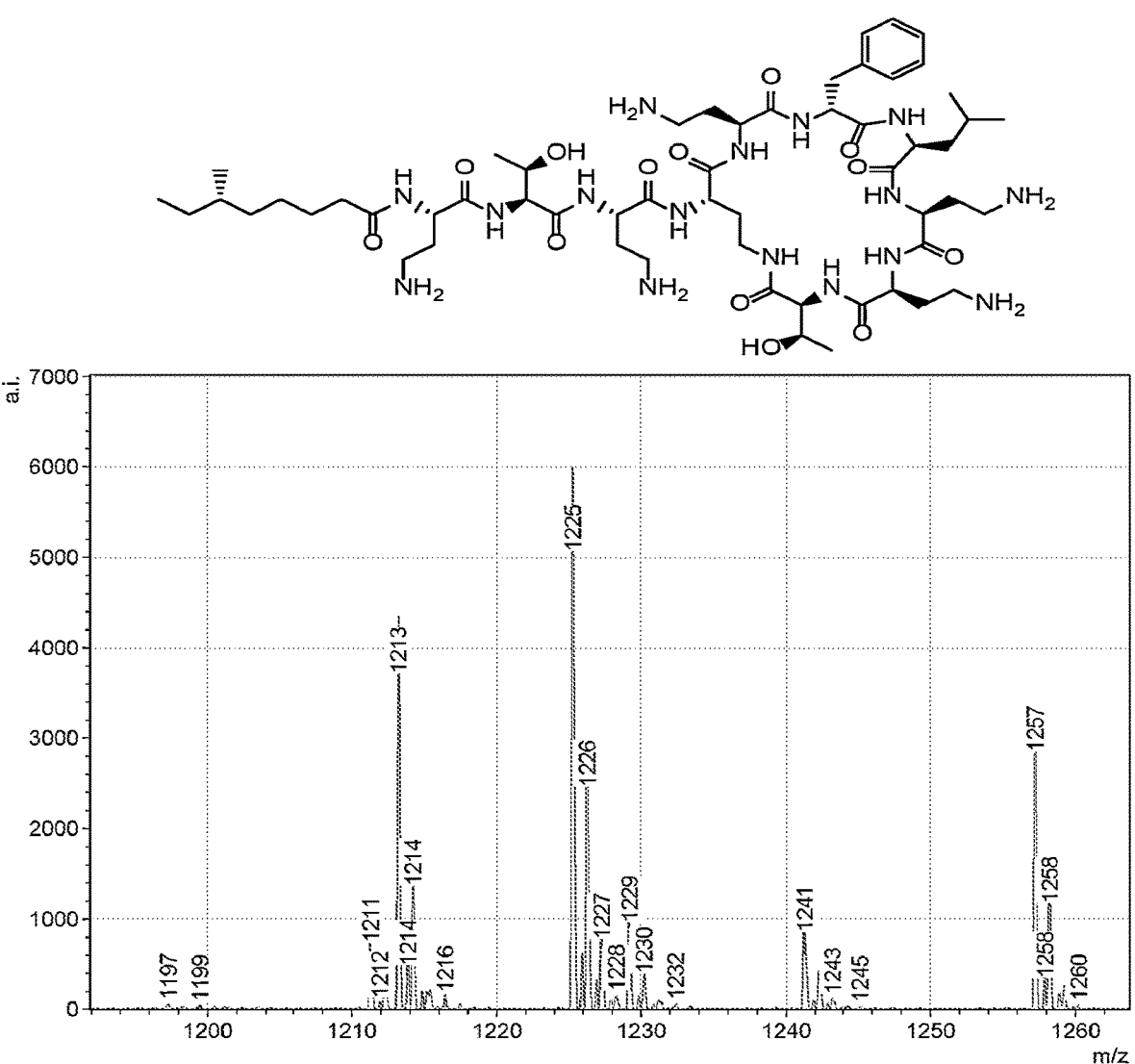
FIG. 21 is a polymyxin map of the distribution of polymyxins in lung tissues analysed by MALDI-MSI (MALDI-7090, Shimadzu).

Mass spectrometry imaging analysis of polymyxin distribution in mouse lungs was achieved by serially sectioning 6-μm frozen slices of lung infected with *Acinetobacter baumannii* and subsequently treated with intra-tracheal administration of polymyxin B. Cryo-sections were loaded onto DIOS substrates and placed in a vacuum desiccator for 30 minutes. A sequential section was collected for haematoxylin and eosin staining for image co-registration. Mounted tissue was scanned for imaging alignment (Epson Perfection V370) and the instrument was calibrated using a mixture of caesium iodide (CsI) adducts, Cs+ (132.91 Da), (Cs)2I+ (392.72 Da), (CsI)2Cs+ (652.53), and a peptide calibration mixture (ProteoMass™, Sigma-Aldrich) of bradykinin fragment 1-7 (756.40 Da), angiotensin 11 (1046.18 Da), and ACTH fragment 18-39 (2,464.20 Da). The distributions of polymyxins in lung tissues from dosed animals were analysed by MALDI-MSI (MALDI-7090, Shimadzu) in reflectron positive mode at a resolution of 50 μm. Resulting polymyxin maps were visualised and normalised against the total ion current (TIC) of each section using IonView software (Shimadzu). See FIGS. 20 and 21.

Those skilled in the art will appreciate that the invention described herein is susceptible to variations and modifications other than those specifically described. It is understood that the invention includes all such variations and modifications which fall within the spirit and scope of the present invention.

The invention claimed is:

1. A method for detecting one or more analytes, the method comprising:

providing a substrate comprising a semiconductor with a porous surface, wherein the porous surface is coated with a fluorocarbon polymeric coating, wherein the fluorocarbon polymeric coating comprises a fluorocarbon plasma polymer produced by contacting the porous surface with a fluorocarbon plasma, contacting the porous surface with a fluid or object so that the one or more analytes are retained on the substrate when present in the fluid or on the object; and analysing the substrate by mass spectrometry to detect the one or more analytes if present on the substrate.

2. The method according to claim 1, wherein the semiconductor is a silicon semiconductor.

3. The method according to claim 1, wherein the porous surface comprises a plurality of pores formed in the semiconductor, the pores having an average pore diameter of from 5 nm to 300 nm.

4. The method according to claim 3, wherein the pores have an average pore diameter of from 50 to 200 nm.

5. The method according to claim 1, wherein the porous surface comprises a plurality of pores formed in the semiconductor, the pores having an average pore depth of from 50 to 15000 nm.

6. The method according to claim 1, wherein the fluorocarbon polymeric coating has a thickness in the range of 5 to 15 nm.

7. The method according to claim 1, wherein the fluorocarbon plasma is a plasma of one or more fluorocarbon gases.

8. The method according to claim 1, wherein analysing the substrate by mass spectrometry comprises using an ionisation technique selected from laser desorption-ionisation (LDI), desorption electrospray ionisation (DESD), atmospheric pressure chemical ionisation (APCI), Fast Atom Bombardment (FAB), and Direct Analysis in Real-Time (DART).

9. The method according to claim 1, wherein the porous surface is contacted with a fluid to detect the one or more analytes when present in the fluid, wherein the fluid is obtained by extracting an aqueous biological fluid with a solvent, wherein the one or more analytes are extracted into the solvent if present in the biological fluid.

10. The method according to claim 1, wherein the porous surface is contacted with a fluid to detect the one or more analytes when present in the fluid, and wherein the method comprises quantifying the concentration of at least one of the analytes in the fluid by comparing a mass spectrometry signal intensity associated with the analyte with a calibration curve of signal intensity versus concentration predetermined for the analyte and the substrate.

11. The method according to claim 1, wherein the analytes are selected from the group consisting of illicit drugs and metabolites thereof, performance enhancing doping agents and metabolites thereof, agrochemical residues and biomarker peptides.

12. The method of claim 1, wherein the fluorocarbon plasma comprises a plasma of one or more fluorocarbon gases selected from $C_4F_8$, $CF_4$ and $CHF_3$, or combinations thereof.

13. A coated substrate for retaining analytes to detect, the substrate comprising a semiconductor with a porous surface, wherein the porous surface is coated with a fluorocarbon polymeric coating, wherein the fluorocarbon polymeric coating comprises a fluorocarbon plasma polymer produced by contacting the porous surface with a fluorocarbon plasma.

14. The coated substrate according to claim 13, wherein the semiconductor is a silicon semiconductor.

15. The coated substrate according to claim 11, wherein the porous surface comprises a plurality of pores formed in the semiconductor, the pores having an average pore diameter of from 5 nm to 300 nm and/or an average pore depth of from 50 to 15000 nm.

16. The coated substrate according to claim 15, wherein the pores have an average pore diameter of from 50 to 200 nm.

17. The coated substrate according to claim 13, wherein the fluorocarbon polymeric coating has a thickness in the range of 5 to 15 nm.

18. A method of producing a coated substrate for retaining analytes to detect, the method comprising:
   providing a substrate comprising a semiconductor with a porous surface; and
   contacting the substrate with a fluorocarbon plasma, thereby coating the porous surface with a fluorocarbon polymeric coating, wherein the fluorocarbon polymeric coating comprises a fluorocarbon plasma polymer.

19. The method according to claim 18, wherein the semiconductor is a silicon semiconductor and wherein the porous surface comprises a plurality of pores formed in the semiconductor, the pores having an average pore diameter of from 5 nm to 300 nm.

20. The method of claim 18, wherein the fluorocarbon plasma comprises a plasma of one or more fluorocarbon gases selected from $C_4F_8$, $CF_4$ and $CHF_3$, or combinations thereof.

* * * * *